United States Patent
Ninomiya et al.

(10) Patent No.: US 9,984,856 B2
(45) Date of Patent: May 29, 2018

(54) ION IMPLANTATION APPARATUS

(71) Applicant: Sumitomo Heavy Industries Ion Technology Co., Ltd., Tokyo (JP)

(72) Inventors: Shiro Ninomiya, Ehime (JP);
Yasuharu Okamoto, Ehime (JP);
Akihiro Ochi, Ehime (JP); Yusuke Ueno, Ehime (JP)

(73) Assignee: SUMITOMO HEAVY INDUSTRIES ION TECHNOLOGY CO., LTD., Tokyo (JP)

( * ) Notice: Subject to any disclaimer, the term of this patent is extended or adjusted under 35 U.S.C. 154(b) by 0 days. days.

(21) Appl. No.: 15/280,604

(22) Filed: Sep. 29, 2016

(65) Prior Publication Data
US 2017/0092464 A1    Mar. 30, 2017

(30) Foreign Application Priority Data

Sep. 30, 2015 (JP) .................. 2015-193965

(51) Int. Cl.
*A61N 5/00* (2006.01)
*H01J 37/317* (2006.01)
*H01L 21/265* (2006.01)

(52) U.S. Cl.
CPC .... *H01J 37/3171* (2013.01); *H01L 21/26586* (2013.01)

(58) Field of Classification Search
CPC ...... H01J 37/30; H01J 37/317; H01J 37/3172; H01J 37/3171; H01L 21/26; H01L 21/265; H01L 21/2652; H01L 21/26566; H01L 21/2658; H01L 21/26593; H01L 21/26586

USPC ................. 250/492.2, 492.21, 492.22, 492.3
See application file for complete search history.

(56) References Cited

U.S. PATENT DOCUMENTS

| | | | |
|---|---|---|---|
| 4,736,107 A * | 4/1988 | Myron | ................ H01J 37/3171 |
| | | | 250/492.2 |
| 6,750,462 B2 | 6/2004 | Iwasawa et al. | |
| 7,217,934 B2 | 5/2007 | Mori | |
| 8,017,922 B2 | 9/2011 | Matsumoto et al. | |

(Continued)

FOREIGN PATENT DOCUMENTS

| | | |
|---|---|---|
| JP | S61-002252 A | 1/1986 |
| JP | S62-117248 A | 5/1987 |

(Continued)

*Primary Examiner* — Jason McCormack
(74) *Attorney, Agent, or Firm* — Michael Best & Friedrich LLP

(57) ABSTRACT

An ion implantation apparatus performs a plurality of ion implantation processes having different implantation conditions to a same wafer successively. The plurality of ion implantation processes are: (a) provided so that twist angles of the wafer differ from each other; (b) configured so that an ion beam is irradiated to a wafer surface to be processed that moves in a reciprocating movement direction; and (c) provided so that a target value of a beam current density distribution of the ion beam is variable in accordance with a position of the wafer in the reciprocating movement direction. Before performing the plurality of ion implantation processes to the same wafer successively, a control device executes a setup process in which a plurality of scanning parameters corresponding to the respective implantation conditions of the plurality of ion implantation processes are determined collectively.

17 Claims, 19 Drawing Sheets

(56) References Cited

U.S. PATENT DOCUMENTS

| | | |
|---|---|---|
| 8,368,036 B2 | 2/2013 | Hino |
| 8,692,216 B2 | 4/2014 | Kariya et al. |
| 8,772,741 B2 | 7/2014 | Ninomiya et al. |
| 2006/0289800 A1 | 12/2006 | Murrell et al. |
| 2008/0135753 A1* | 6/2008 | Yamashita ............ G01N 23/225 250/310 |
| 2009/0321630 A1* | 12/2009 | Ryding ................... H01J 37/05 250/282 |
| 2011/0215263 A1* | 9/2011 | Hino ................... H01J 37/1472 250/492.21 |
| 2012/0322248 A1 | 12/2012 | Ninomiya et al. |

FOREIGN PATENT DOCUMENTS

| | | |
|---|---|---|
| JP | S62-145637 A | 6/1987 |
| JP | S62-285355 A | 12/1987 |
| JP | S63-091949 A | 4/1988 |
| JP | H05-315276 A | 11/1993 |
| JP | H06-168696 A | 6/1994 |
| JP | H06-325723 A | 11/1994 |
| JP | 2005-235682 A | 9/2005 |
| JP | 3692999 B2 | 9/2005 |
| JP | 2005-294331 A | 10/2005 |
| JP | 2006-279041 A | 10/2006 |
| JP | 4155327 B2 | 9/2008 |
| JP | 2012-204327 A | 10/2012 |
| JP | 2013-004610 A | 1/2013 |
| JP | 2013-206833 A | 10/2013 |
| JP | 5311112 B2 | 10/2013 |

* cited by examiner

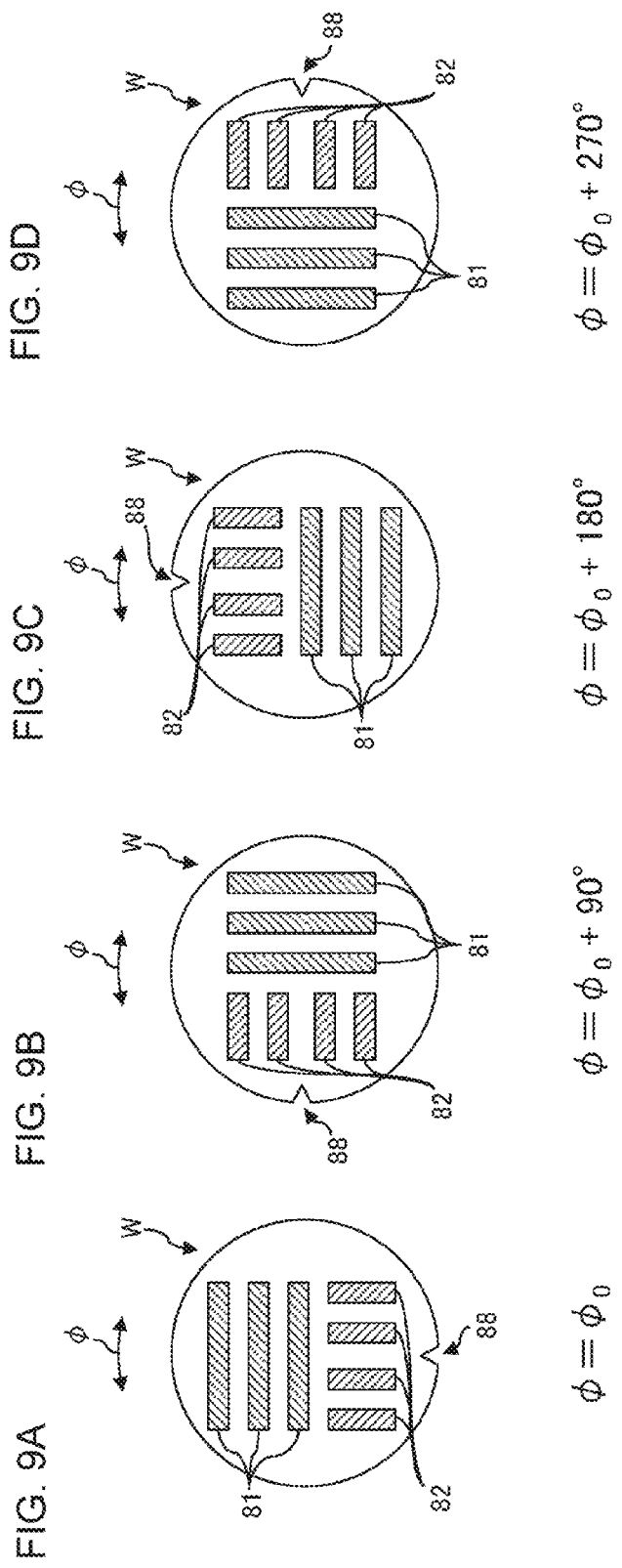

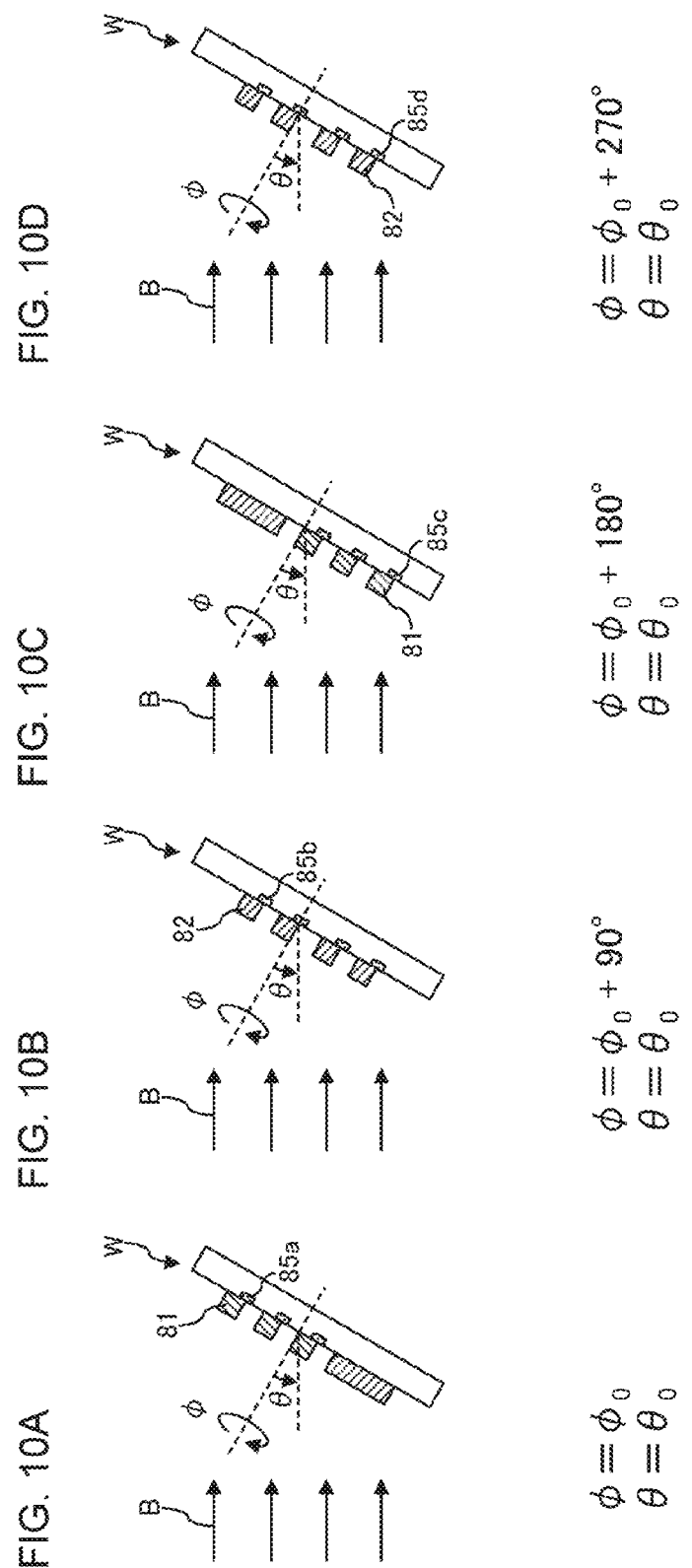

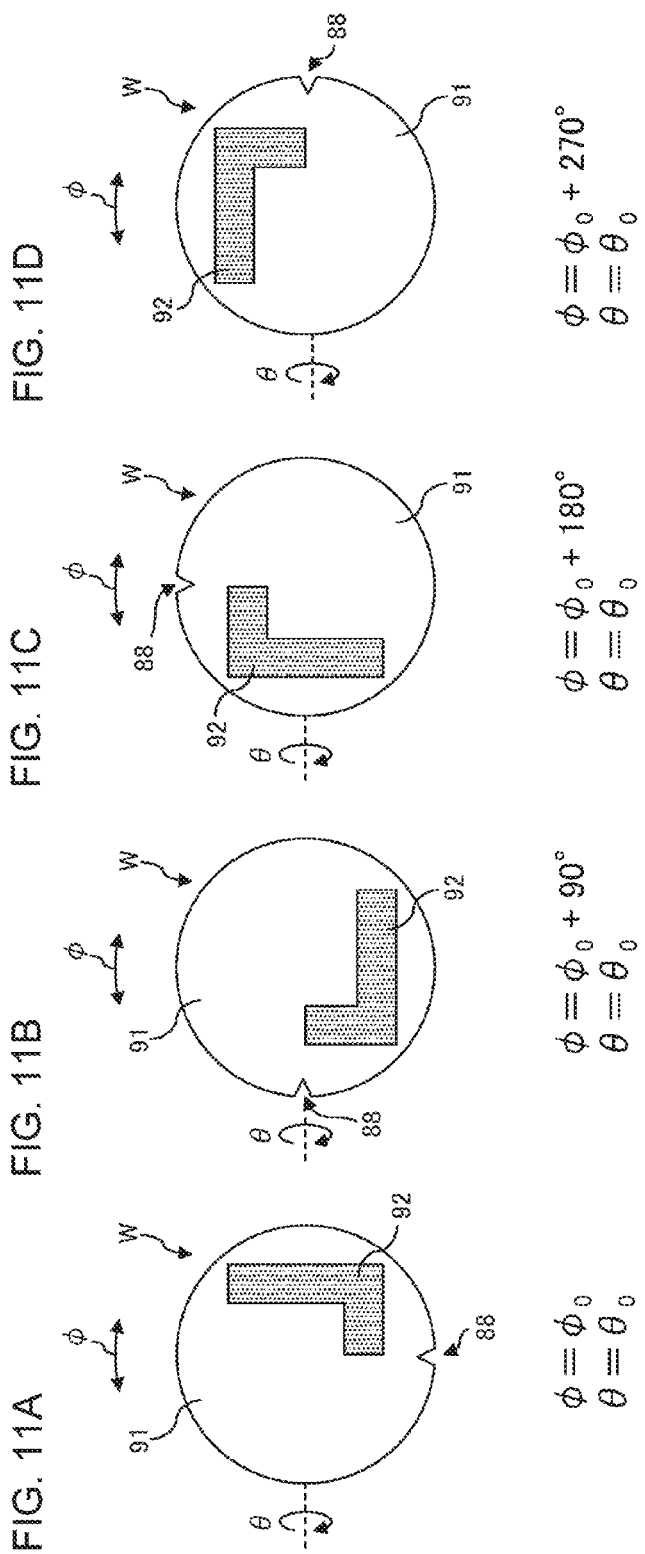

ION IMPLANTATION APPARATUS

RELATED APPLICATION

Priority is claimed to Japanese Patent Application No. 2015-193965, filed on Sep. 30, 2015, the entire content of which is incorporated herein by reference.

BACKGROUND OF THE INVENTION

1. Field of the Invention

The present invention relates to an ion implantation apparatus configured to perform a plurality of ion implantation processes to a same wafer successively.

2. Description of the Related Art

In a semiconductor production process, a process of implanting ions into a semiconductor wafer (hereinafter, it may be referred to as an "ion implantation process") is generally performed for the purpose of changing the conductivity and/or the crystalline structure of the semiconductor and the like. An apparatus that is used in the ion implantation process is called an ion implantation apparatus and has a function of forming an ion beam by generating ions using an ion source and accelerating the generated ions and a function of transporting the ion beam to an implantation processing chamber and irradiating a wafer with the ion beam inside the implantation processing chamber.

In order to implant ions into an entire surface of a wafer as a processing target, a beam scanner causes an ion beam to scan in a reciprocating manner while the wafer reciprocates in a direction perpendicular to the beam scanning direction. At this time, the amount of the ion beam irradiated to each point of the wafer is controlled by changing a beam scanning speed or a reciprocating speed in accordance with the irradiation position of the ion beam on the wafer. Also, by performing an implantation process with a different wafer rotation angle plural times, a non-uniform dose amount distribution can be formed in a wafer plane.

Conventionally, in a case where the plural implantation processes are performed by changing the wafer rotation angle, an ordinary way is to perform ion implantation processing without changing a beam condition of an ion beam to be irradiated to a wafer between implantation processes so as to obtain a dose amount distribution formed in a desired rotationally-symmetric shape. If a dose amount distribution formed in a rotationally-asymmetric shape is to be obtained, the beam condition must be changed in each implantation process having a different wafer rotation angle, and a beam setup process for switching the beam condition will be required between implantation processes. It generally takes several tens of seconds to several tens of minutes for the beam setup process. If the beam setup process must be performed each time of changing the wafer rotation angle, this will significantly lower productivity of the ion implantation processing.

SUMMARY OF THE INVENTION

The present invention is made in consideration of such situations, and an object thereof is to provide an ion implantation apparatus that satisfies both productivity of ion implantation processing and accuracy of wafer in-plane non-uniform implantation.

An ion implantation apparatus according to an aspect of the present invention is an ion implantation apparatus configured to perform a plurality of ion implantation processes having different implantation conditions to a same wafer successively. The apparatus includes an energy adjusting mechanism that enables adjustment of implantation energy of an ion beam, a beam scanner that causes the ion beam to scan in a reciprocating manner in a predetermined scanning direction, a measuring instrument that measures a beam current density distribution in the scanning direction of the ion beam that scans in the reciprocating manner, a platen movement device that holds a wafer so that the ion beam that scans in the reciprocating manner is irradiated to a wafer surface to be processed, and a control device that determines a scanning parameter of the beam scanner based on a measurement result of the measuring instrument so that the beam current density distribution corresponds to a target value set in an implantation condition, and that performs each of the ion implantation processes. The platen movement device includes a reciprocating movement mechanism that causes the wafer to reciprocate in a reciprocating movement direction perpendicular to the scanning direction, a twist angle adjustment mechanism that adjusts a twist angle between an alignment mark provided at an outer circumferential portion of the wafer and a reference position by rotating the wafer around a normal line of the wafer surface to be processed, and a tilt angle adjustment mechanism that adjusts a tilt angle between a traveling direction of the ion beam toward the wafer surface to be processed and the normal line of the wafer surface to be processed. The plurality of ion implantation processes are: (a) provided with respective implantation conditions so that twist angles of the wafer differ from each other; (b) configured so that the ion beam that scans in the reciprocating manner is irradiated to the wafer surface to be processed that moves in the reciprocating movement direction; and (c) provided with the respective implantation conditions so that a target value of the beam current density distribution of the ion beam that is irradiated to the wafer surface to be processed is variable in accordance with a position of the wafer in the reciprocating movement direction. Before performing the plurality of ion implantation processes to the same wafer successively, the control device executes a setup process in which a plurality of scanning parameters corresponding to a plurality of target values of the beam current density distributions set as the respective implantation conditions of the plurality of ion implantation processes are determined collectively.

Optional combinations of the aforementioned constituting elements, and implementations of the invention in the form of methods, apparatuses, and systems, may also be practiced as additional modes of the present invention.

BRIEF DESCRIPTION OF THE DRAWINGS

FIGS. 9A to 9D schematically illustrate changes of a twist angle;

FIGS. 10A to 10D schematically illustrate high tilt angle implantation processes having different twist angles;

FIGS. 11A to 11D schematically illustrate high tilt angle implantation processes having different twist angles from each other and having a non-uniform dose amount distribution in the wafer surface to be processed;

DETAILED DESCRIPTION OF THE INVENTION

Figure 1:
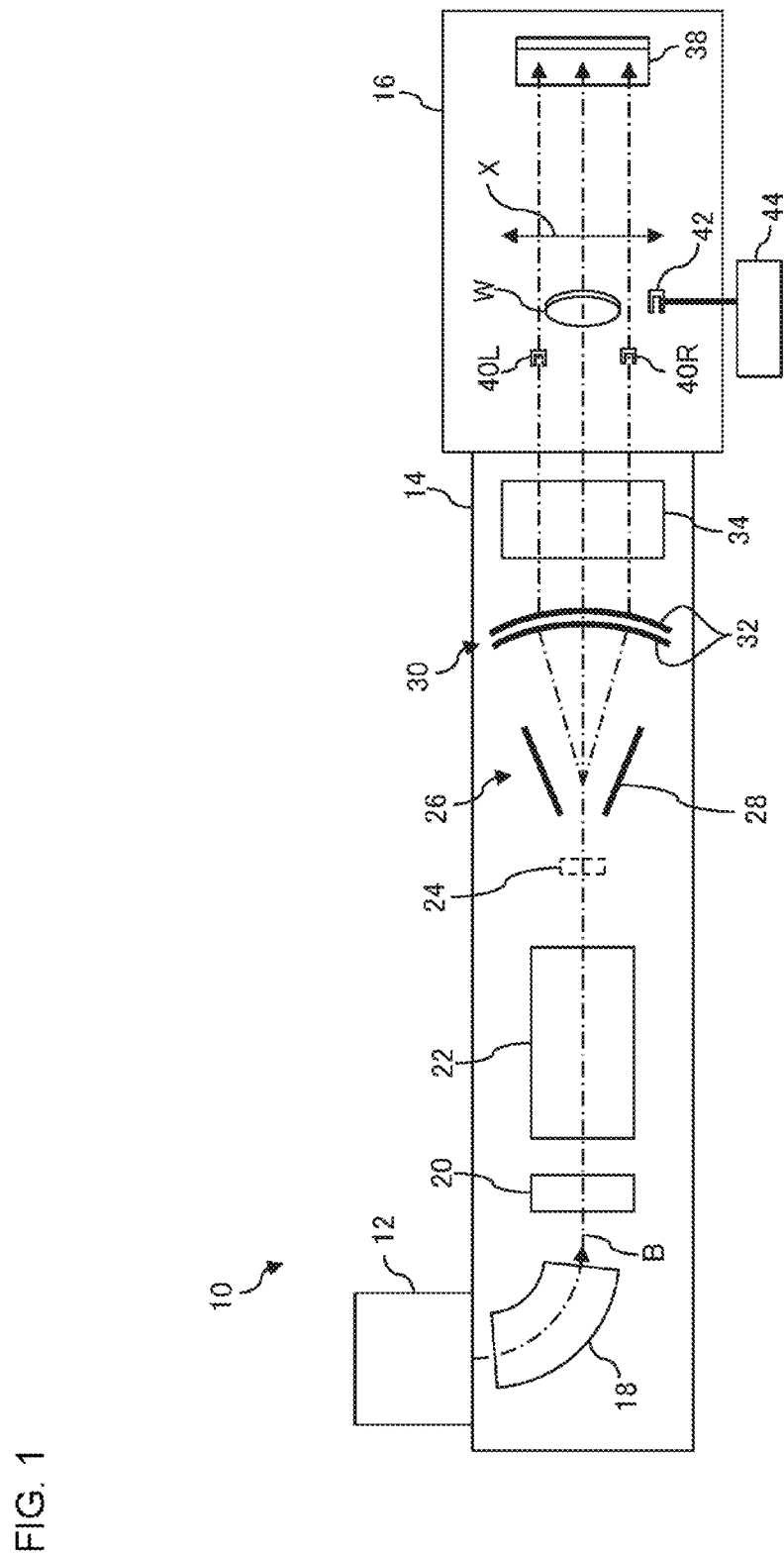
FIG. 1 is a top view that illustrates a schematic configuration of an ion implantation apparatus according to an embodiment.

The invention will now be described by reference to the preferred embodiments. This does not intend to limit the scope of the present invention, but to exemplify the invention.

Hereinafter, embodiments of the present invention will be described in detail with reference to the drawings. In description of the drawings, the same reference numeral is assigned to the same element, and duplicate description thereof will not be presented as is appropriate. The configuration described below is merely an example but does not limit the scope of the present invention.

Before describing the embodiments, an overview of the present invention will be described. An ion implantation apparatus according to an embodiment is an ion implantation apparatus configured to perform a plurality of ion implantation processes having different implantation conditions to a same wafer successively. This ion implantation apparatus includes a beam scanner that causes an ion beam to scan in a reciprocating manner in a predetermined scanning direction, a measuring instrument that measures a beam current density distribution in the scanning direction of the ion beam that scans in the reciprocating manner, a platen movement device that holds a wafer so that the ion beam that scans in the reciprocating manner is irradiated to a wafer surface to be processed, and a control device that determines a scanning parameter of the beam scanner based on a measurement result of the measuring instrument so that the beam current density distribution corresponds to a target value set in an implantation condition to perform each ion implantation process. The platen movement device includes a reciprocating movement mechanism that causes the wafer to reciprocate in a reciprocating movement direction perpendicular to the beam scanning direction, a twist angle adjustment mechanism that adjusts a twist angle between an alignment mark provided at an outer circumferential portion of the wafer and a reference position by rotating the wafer around a normal line of the wafer surface to be processed, and a tilt angle adjustment mechanism that adjusts a tilt angle between a traveling direction of the ion beam toward the wafer surface to be processed and the normal line of the wafer surface to be processed.

The plurality of ion implantation processes are provided with respective implantation conditions so that the twist angles of the wafer differ from each other, are configured so that the ion beam that scans in the reciprocating manner is irradiated to the wafer surface to be processed that moves in the reciprocating movement direction, and are provided with the respective implantation conditions so that the target value of the beam current density distribution of the ion beam that is irradiated to the wafer surface to be processed is variable in accordance with a position of the wafer in the reciprocating movement direction. For example, for the plurality of ion implantation processes, respective implantation conditions are set so that target values of wafer in-plane dose amount distributions may be in mutually different non-uniform shapes respectively, and to achieve respective non-uniform dose amount distribution shapes, respective implantation conditions are set so that the target values of the beam current density distributions differ from each other. Before performing the respective ion implantation processes, execution of "a setup process," in which the ion beam is adjusted to obtain beam current density distributions set in the respective implantation conditions, is required.

In a case of performing a plurality of ion implantation processes to a same wafer successively, a case where the setup process must be executed each time of changing the implantation condition may have a large effect on productivity of the ion implantation processing. For example, in a case where a plurality of ion implantation processes having different implantation conditions are performed to a plurality of wafers, the setup process needs to be executed each time between respective implantation processes for the plurality of wafers, and the productivity is lowered as much as extended time for the setup processes in the entire processing.

In the present embodiment, before performing a plurality of ion implantation processes to a same wafer successively, executed is a setup process in which a plurality of scanning parameters corresponding to a plurality of target values of beam current density distributions set as respective implantation conditions are determined collectively. In each ion implantation process, since an ion beam is emitted based on the scanning parameter set in the setup process collectively, no setup process for switching an implantation condition is required between implantation processes. As a result, since the plurality of ion implantation processes having different implantation conditions can be performed successively to the plurality of wafers without executing setup processes in the middle, productivity of the ion implantation processing can be improved. Also, in each ion implantation process having a different twist angle of a wafer, an ion beam having a different beam current density distribution can be emitted based on the scanning parameter determined collectively. Accordingly, accuracy of wafer in-plane non-uniform implantation can be improved.

[Configuration of Ion Implantation Apparatus]

Figure 2:
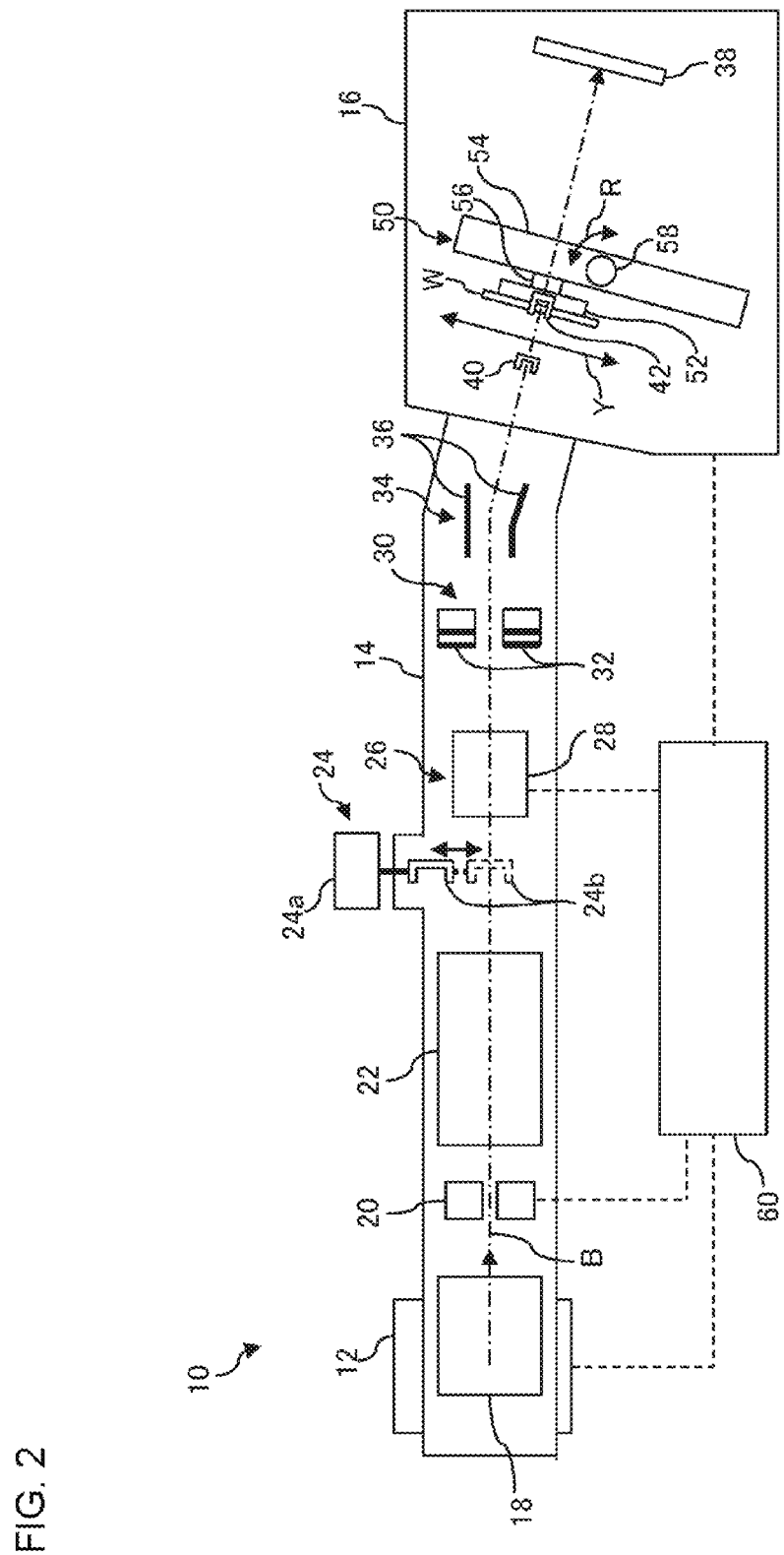
FIG. 2 is a side view that illustrates a schematic configuration of an ion implantation apparatus of FIG. 1.

FIG. 1 is a top view that schematically illustrates an ion implantation apparatus 10 according to an embodiment, and FIG. 2 is a side view that illustrates a schematic configuration of the ion implantation apparatus 10 according to an embodiment.

The ion implantation apparatus 10 is configured to perform an ion implantation processing for the surface of a processing object W. The processing object W, for example, is a substrate or, for example, is a semiconductor wafer. Hereinafter, while the processing object W may be referred to as a wafer W for the convenience of description, this is not intended to limit the target for the implantation process to a specific object.

The ion implantation apparatus 10 is configured to irradiate with an ion beam B the entirety of the wafer W by causing the beam to scan in a reciprocating manner in a direction and causing the wafer W to move in a reciprocating manner in a direction perpendicular to the direction. Here, for the convenience of description, the traveling direction of the ion beam B traveling in a designed beam trajectory is defined as a z direction, and a plane perpendicular to the z direction is defined as an xy plane. In a case where the ion beam B scans the processing object W, the scanning direction of the beam is set as a x direction, and a direction perpendicular to the z direction and the x direction is set as a y direction. Accordingly, the reciprocating scanning of the beam is performed in the x direction, and the reciprocating movement of the wafer W is performed in the y direction.

The ion implantation apparatus 10 includes: an ion source 12; a beamline device 14; a implantation processing chamber 16; and a control device 60. The ion source 12 is configured to supply the ion beam B to the beamline device 14. The beamline device 14 is configured to transport ions from the ion source 12 to the implantation processing chamber 16. In addition, the ion implantation apparatus 10 includes an evacuation system (not illustrated in the figure) that is used for providing a desired vacuum environment for the ion source 12, the beamline device 14, and the implantation processing chamber 16.

The beamline device 14, for example, includes: a mass analyzing unit 18; a variable aperture 20; a beam focusing unit 22; a first beam measuring instrument 24; a beam scanner 26; a collimating lens 30 or a beam collimating device; and an angular energy filter (AEF) 34 in order from the upstream side. Here, the upstream side of the beamline device 14 represents a side close to the ion source 12, and the downstream side of the beamline device 14 represents a side close to the implantation processing chamber 16 (or a beam stopper 38).

The mass analysis unit 18 is disposed at the downstream side of the ion source 12 and is configured to select a necessary ion species from the ion beam B extracted from the ion source 12 by a mass analysis.

The variable aperture 20 is an aperture capable of adjusting the aperture width, and adjusts the beam current amount of the ion beam B passing through the aperture by changing the aperture width. The variable aperture 20 includes, for example, upper and lower aperture plates which are disposed on the beam line interposed therebetween, and may adjust the beam current amount by changing the gap between the aperture plates.

The beam converging unit 22 includes a focusing lens such as a quadrupole focusing device (Q lens) and is configured to shape the ion beam B passing through the variable aperture 20 into a desired cross-sectional shape.

The first beam measuring instrument 24 is an injector flag Faraday cup that is disposed so as to move in or out on the beamline and measures the current of the ion beam. The first beam measuring instrument 24 includes: a faraday cup 24b that measures a beam current and a drive unit 24a that moves the faraday cup 24b up and down. As indicated by a dashed line in FIG. 2, in a case where the faraday cup 24b is arranged on a beamline, the ion beam B is blocked by the faraday cup 24b. On the other hand, as indicated by a solid line in FIG. 2, in a case where the faraday cup 24b is taken off from the beamline, the blocking of the ion beam B is cancelled.

The beam scanner 26 is configured to provide reciprocating scanning of the beam and is a deflection member that causes the shaped ion beam B to scan in the x direction. The beam scanner 26 includes a pair of scanner electrodes 28 that are disposed to face each other in the x direction. The pair of the scanner electrodes 28 is connected to a variable voltage power supply (not illustrated in the figure), and, by periodically changing a voltage applied to the pair of the scanner electrodes 28, an electric field generated between the electrodes is changed so as to deflect the ion beam B at various angles. In this way, the ion beam B scans over the scan range extracting in the x direction. In FIG. 1, the scanning direction and the scan range of the ion beam are illustrated by an arrow X as an example, and a plurality of trajectories of the ion beam B in the scan range are denoted by chain lines.

The collimating lens 30 is configured to parallelize the traveling direction of the scanned ion beam B to the designed beam trajectory. The collimating lens 30 includes a plurality of P-lens electrodes 32 each having an arc shape that has a passage slit of the ion beam B at the center portion. Each P-lens electrode 32 is connected to a high-voltage power supply (not illustrated in the figure) and allows the traveling directions of the ion beam B to be parallel by applying the electric field generated by the application of the voltage to the ion beam B. It is to be noted that the collimating lens 30 may be replaced with another beam collimating device, and the beam collimating device may be configured as a magnetic device that uses a magnetic field. At the downstream side of the collimating lens 30, an AD (Accel/Decel) column (not illustrated in the figure) configured to accelerate or decelerate the ion beam B may be provided.

The angular energy filter (AEF) 34 is configured to analyze the energy of the ion beam B, deflect the ion having a necessary energy downward at an appropriate angle, and lead the ion to the implantation processing chamber 16. The angular energy filter 34 includes a pair of AEF electrodes 36 used for deflection by an electric field, and the pair of AEF electrodes 36 are connected to a high-voltage power supply (not illustrated in the figure). In the case illustrated in FIG. 2, by applying a positive voltage to the upper AEF electrode and applying a negative voltage to the lower AEF electrode, the ion beam B is deflected downward from the beam trajectory. Here, the angular energy filter 34 may be configured by a magnetic device used for deflection by a magnetic field or may be configured by a combination of a pair of AEF electrodes used for deflection by an electric field and a magnetic device used for deflection by a magnetic field.

In this way, the beamline device 14 supplies the ion beam B to be irradiated on the wafer W to the implantation processing chamber 16.

As illustrated in FIG. 2, the implantation processing chamber 16 includes a platen movement device 50 that holds one or a plurality of wafer(s) W. The platen movement device 50 includes a wafer holding unit 52, a reciprocating movement mechanism 54, a twist angle adjustment mechanism 56, and a tilt angle adjustment mechanism 58. The wafer holding unit 52 includes an electrostatic chuck or the like adapted to hold the wafer W. The reciprocating movement mechanism 54 causes the wafer holding unit 52 to reciprocate in a reciprocating movement direction (y direction) perpendicular to a beam scanning direction (x direction) to cause the wafer held on the wafer holding unit 52 to reciprocate in the y direction. In FIG. 2, the arrow Y illustrates the reciprocating movement of the wafer W.

The twist angle adjustment mechanism 56 is a mechanism that adjusts a rotation angle of the wafer W and adjusts a twist angle between an alignment mark provided at an outer circumferential portion of the wafer and a reference position by rotating the wafer W around a normal line of a wafer surface to be processed. Here, the alignment mark of the wafer refers to a notch or an orientation flat provided at the outer circumferential portion of the wafer and a reference mark for an angular position in a direction of a crystal axis of the wafer or in a circumferential direction of the wafer. As illustrated in the figure, the twist angle adjustment mechanism 56 is provided between the wafer holding unit 52 and the reciprocating movement mechanism 54 and reciprocates with the wafer holding unit 52.

The tilt angle adjustment mechanism 58 is a mechanism that adjusts tilt of the wafer W and adjusts a tilt angle between a traveling direction of the ion beam B toward the wafer surface to be processed and the normal line of the wafer surface to be processed. In the present embodiment, among tilting angles of the wafer W, an angle in which an axis in the x direction is a central axis of rotation is regarded as the tilt angle for the adjustment. The tilt angle adjustment mechanism 58 is provided between the reciprocating movement mechanism 54 and a wall surface of the implantation processing chamber 16 and is configured to adjust the tilt angle of the wafer W by rotating the entire platen movement device 50 including the reciprocating movement mechanism 54 in an R direction.

The implantation processing chamber 16 includes a beam stopper 38. In a case where no wafer W exists on the beam trajectory, the ion beam B is incident on the beam stopper 38. The implantation processing chamber 16 is also provided with a second beam measuring instrument 44 which measures a beam current amount and a beam current density distribution of the ion beam. The second beam measuring instrument 44 includes side cups 40R and 40L and a center cup 42.

The side cups 40R and 40L are disposed so as to be deviated from the wafer W in the x direction, and are disposed at a position where the ion beam directed to the wafer W is not interrupted during the ion implantation processing. Since the ion beam B over-scans in a range exceeding the range of the wafer W, a part of the scanning beam is input to the side cups 40R and 40L even in the ion implantation processing. Accordingly, the beam current amount is measured during the ion implantation processing. The measurement values of the side cups 40R and 40L are transmitted to the second beam measuring instrument 44.

The center cup 42 is used to measure the beam current density distribution of the surface (to-be-processed wafer surface) of the wafer W. The center cup 42 is movable, and is retracted from the wafer position during the ion implantation processing, and is inserted into the wafer position when the wafer W does not exist at the irradiation position. The center cup 42 measures the beam current density distribution in the beam scanning direction by measuring the beam current amount while the center cup 42 is moved in the x direction. The measurement value of the center cup 42 is transmitted to the second beam measuring instrument 44. In addition, the center cup 42 may be formed in an array shape in which a plurality of faraday cups are arranged in the x direction so as to simultaneously measure the ion irradiation amount of a plurality of positions in the beam scanning direction.

Figure 3:
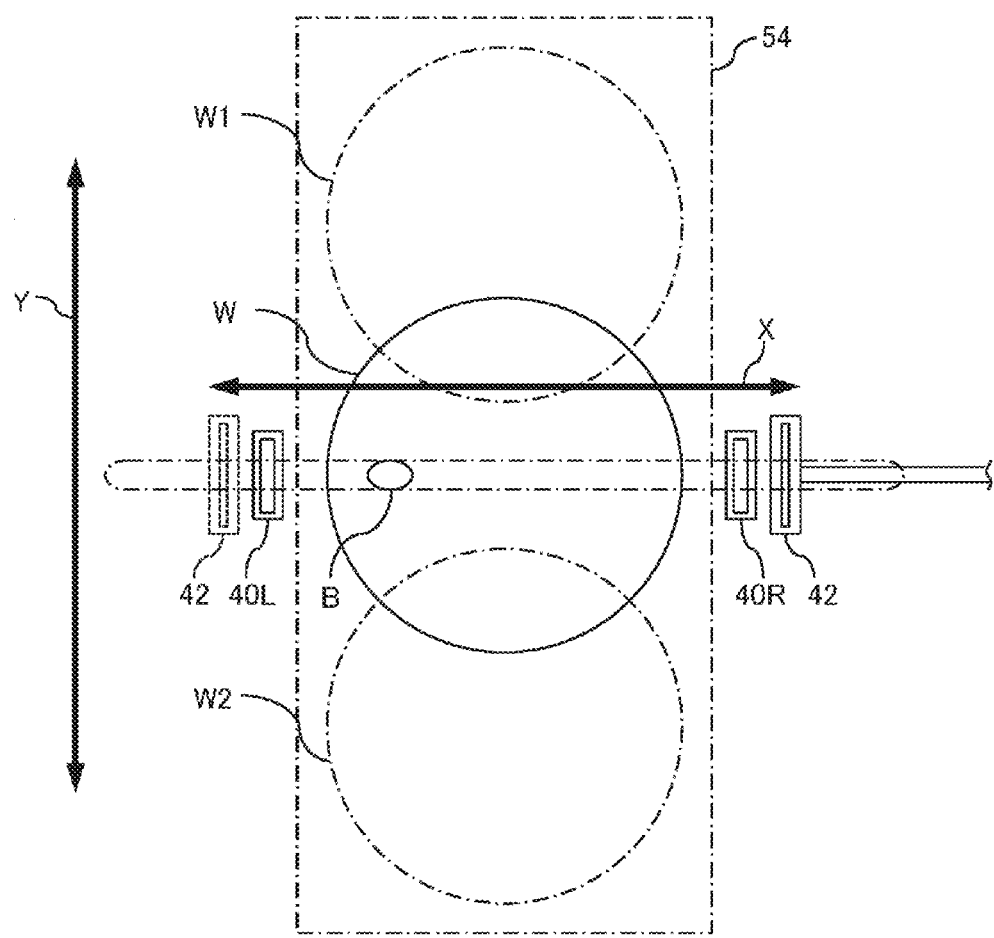
FIG. 3 is a front view illustrating relationship between a wafer that moves in a reciprocating manner and a beam that scans in a reciprocating manner.

FIG. 3 is a front view illustrating a relation between the reciprocated wafer W and the scanned ion beam B. In FIG. 3, the ion beam B scans in the horizontal direction (the x direction), and the wafer W is reciprocated in the vertical direction (the y direction) while being held by the reciprocating movement mechanism 54. FIG. 3 illustrates the operation range of the reciprocating movement mechanism 54 by illustrating the wafer W1 at the uppermost position and the wafer W2 at the lowermost position.

Further, as for the ion beam B caused to scan by the beam scanner, the scanning range of the ion beam is indicated by a horizontally long region surrounded by the dash-dotted chain line. The ion beam B is configured to be over-scanned in a range passing through the positions of the side cups 40R and 40L disposed at the right and left sides of the reciprocating movement mechanism 54 or the position of the center cup 42 movable in the x direction. In addition, FIG. 3 illustrates a state where the ion beam B which is long in the horizontal direction is scanned. However, the shape of the ion beam B may be long in the vertical direction or may be substantially circular.

Figure 4:
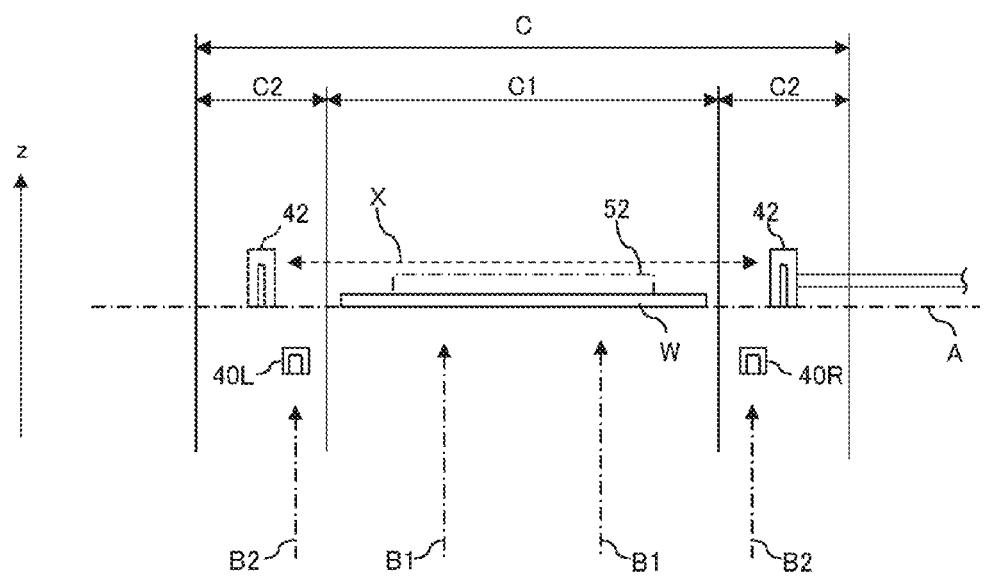
FIG. 4 is an upper view illustrating a scanning range of the ion beam.

FIG. 4 is a view illustrating the scanning range of the ion beam B and corresponds to the top view of FIG. 3. In FIG. 4, the entire scannable range of the ion beam B is indicated by a scanning range C. The scanning range C may be roughly classified into two ranges of an irradiation area C1 and a non-irradiation area C2. The irradiation area C1 is the range of the wafer W, and may be called an inner range in relation to the positions of the side cups 40R and 40L. Thus, the ion beam B1 directed to the irradiation area C1 is input to the wafer W reciprocated by the reciprocating movement mechanism 54, and hence the ion beam contributes to the ion implantation processing. Meanwhile, the non-irradiation area C2 is an area which is located at the outside of the irradiation area C1 and corresponds to the outside of the range of the wafer W. Thus, an ion beam B2 which is directed to the non-irradiation area C2 is not input to the wafer W reciprocated by the reciprocating movement mechanism 54, and does not contribute to the ion implantation processing.

As illustrated in FIG. 4, the movable center cup 42 may measure the beam current density distribution at the position A corresponding to the wafer surface to be processed in the irradiation area C1 and the non-irradiation area C2. The position A corresponds to the same position of the wafer surface to be processed in the z direction with respect to the z direction as the traveling direction of the ion beam B. When the irradiation area C1 is divided into about one thousand micro zones and the bean current amount is measured for each micro zone while the center cup 42 is moved in the x direction, the beam current density distribution in the beam scanning direction (the x direction) on the wafer surface to be processed may be obtained.

Figure 5:
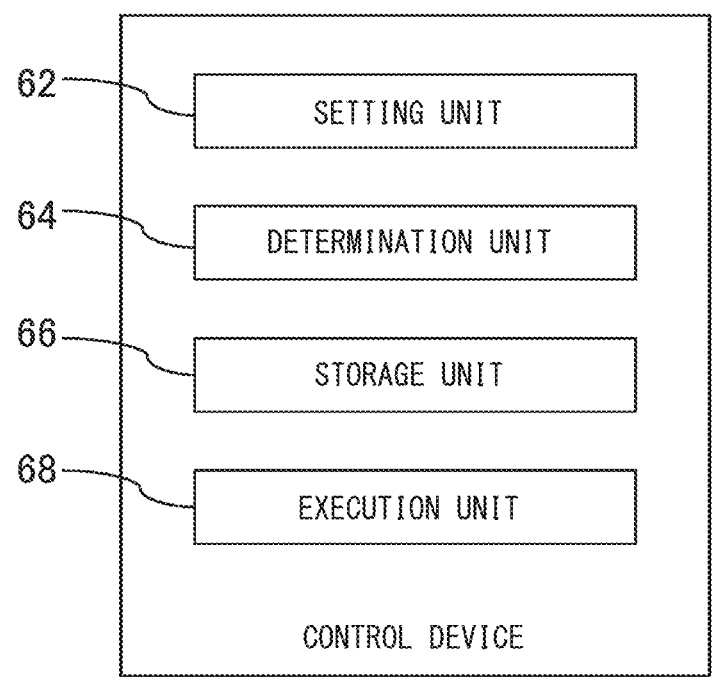
FIG. 5 is a block diagram illustrating a functional configuration of a control device.

FIG. 5 is a block diagram illustrating a functional configuration of the control device 60. The control device 60 controls the operation of each of the devices constituting the ion implantation apparatus 10. The control device 60 includes a setting unit 62, a determination unit 64, a storage unit 66, and an execution unit 68.

The blocks illustrated in the block diagram of the present specification are realized by components or mechanical devices using a CPU of a computer in hardware and are realized by a computer program or the like in software. However, the functional blocks herein are realized by the cooperation thereof. Thus, it is understood that the functional blocks are realized in various ways by the combination of hardware and software by the person skilled in the art.

The setting unit 62 receives setting of respective implantation conditions for a plurality of ion implantation processes to be performed. The setting unit 62 receives setting of 1) an ion species, 2) implantation energy, 3) a beam current amount, 4) a beam current density (beam shape), 5) a wafer in-plane average dose amount, 6) a wafer in-plane dose amount distribution, 7) a tilt angle, 8) a twist angle, and the like as items of each implantation condition for each ion implantation process. Also, in a case where an implantation condition item in which a wafer in-plane dose amount distribution is in a non-uniform shape is to be set, the setting unit 62 further receives setting of 9) a dose amount distribution per region.

Figure 6A:
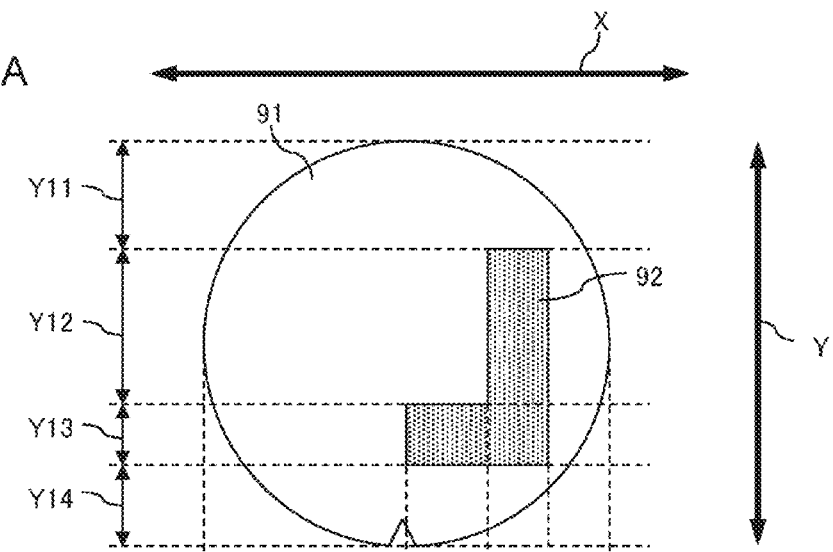
FIG. 6A schematically illustrates a plurality of regions set on a wafer surface to be processed.
Figure 6B:
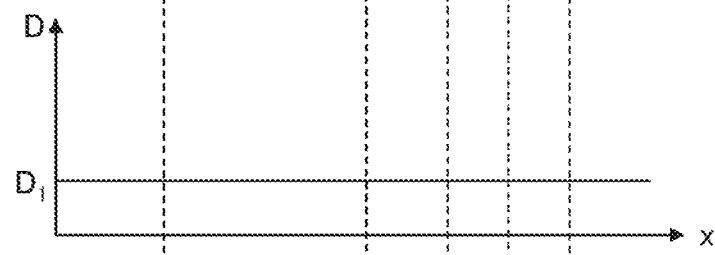
FIGS. 6B to 6D are graphs schematically illustrating target values of dose amount distributions set for the respective regions.
Figure 6C:
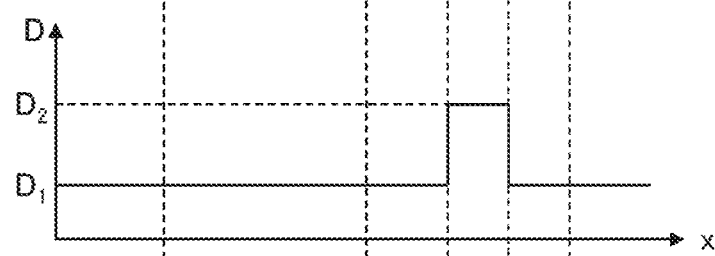
Figure 6D:
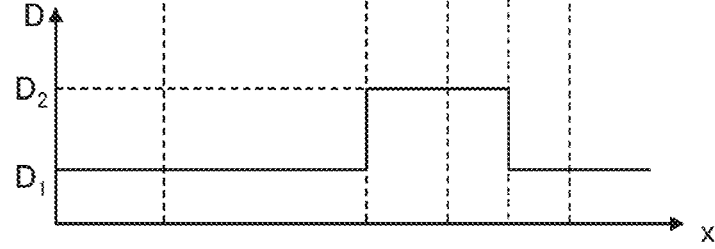

FIG. 6A schematically illustrates a plurality of regions Y11 to Y14 set on the wafer surface to be processed, and FIGS. 6B to 6D are graphs schematically illustrating target values of dose amount distributions set for the respective regions. FIG. 6A illustrates a case where an implantation condition in which "a wafer in-plane dose amount distribution" is in a non-uniform shape is set and illustrates a large dose amount region 92 having a relatively large dose amount (ion implantation amount) by a shaded area. A region except the large dose amount region 92 is a small dose amount region 91 having a relatively smaller ion implantation amount than the large dose amount region 92. The large dose amount region 92 can be set to have a rotationally-asymmetric shape and can be set to have, for example, an L-shaped island shape, as illustrated in the figure. It is to be noted that the dose amount distribution on the wafer surface to be processed may be formed in a shape other than the L shape or may be formed so that the dose amount may change continuously in accordance with the position on the wafer surface to be processed.

In the case where the non-uniform dose amount distribution is set as illustrated in FIG. 6A, the plurality of regions Y11, Y12, Y13, and Y14 are set on the wafer surface to be processed. The plurality of regions Y11, Y12, Y13, and Y14 are set to be regions elongated in the x direction serving as the beam scanning direction with portions at which the value of the dose amount changes in the y direction serving as the reciprocating movement direction of the wafer as boundaries. In other words, the plurality of regions Y11 to Y14 are set so that the region on the wafer surface to be processed may be separated into strip shaped regions which may be successive in the y direction serving as the reciprocating movement direction of the wafer. Meanwhile, the plurality of regions on the wafer surface to be processed are set with reference to the y direction serving as the reciprocating movement direction of the wafer even in a case where the twist angle of the wafer is different.

Also, as illustrated in FIGS. 6B to 6D, the dose amount distributions in the x direction in the respective regions Y11 to Y14 are set as one of the implantation condition items. FIG. 6B illustrates the dose amount distribution corresponding to the first region Y11 or the fourth region Y14, and an entire region thereof has a first dose amount $D_1$ in the small dose amount region 91. FIG. 6C illustrates the dose amount distribution corresponding to the second region Y12, and a range thereof corresponding to the small dose amount region 91 has the first dose amount $D_1$ while a range thereof corresponding to the large dose amount region 92 has a second dose amount $D_2$. Similarly, FIG. 6D illustrates the dose amount distribution corresponding to the third region Y13, and a range of the first dose amount $D_1$ and a range of the second dose amount $D_2$ are defined to have different distributions from those of the second region Y12.

The determination unit 64 performs a setup process in which parameters of the respective devices constituting the ion implantation apparatus 10 are determined so that the implantation conditions set in the setting unit 62 may be satisfied. The determination unit 64 determines a gas species of the ion source 12 and values of an extraction voltage of the ion source 12 and a magnetic field or a current of the mass analysis unit 18 as parameters for adjusting 1) the ion species. The determination unit 64 determines values of an extraction voltage of the ion source 12, an applied voltage of the P-lens electrode 32, and an applied voltage of the AD column as parameters for adjusting 2) the implantation energy. Accordingly, the ion source 12, the P-lens electrode 32, and the AD column can be referred to as energy adjusting mechanisms.

The determination unit 64 determines various parameters such as a gas amount, an arc current, an arc voltage, and a source magnet current of the ion source 12 and a parameter for adjusting an aperture width of the variable aperture 20 as parameters for adjusting 3) the beam current amount. The determination unit 64 determines a voltage value to be applied to the Q lens included in the beam converging unit 22 as parameters for adjusting 4) the beam current density. The determination unit 64 determines the respective parameters so that 3) the beam current amount may be a desired value mainly based on a measurement result of the first beam measuring instrument 24 and determines the respective parameters so that 4) the beam current density may be a desired value mainly based on a measurement result of the second beam measuring instrument 44.

The determination unit 64 determines a scanning parameter of the beam scanner 26 as a parameter for adjusting 5) the wafer in-plane average dose amount, 6) the wafer in-plane dose amount distribution, and 9) the dose amount distribution per region. The determination unit 64 determines the scanning parameter of the beam scanner 26 so that the beam current density distribution in the scanning direction on the wafer surface to be processed may be in a shape corresponding to a targeted dose amount distribution. More specifically, the determination unit 64 determines the scanning parameter so that the scanning speed of the beam may be low at a position having a relatively large target dose amount and may be high at a position having a relatively small target dose amount based on a measurement result of the beam current density distribution from the second beam measuring instrument 44.

Figure 7A:
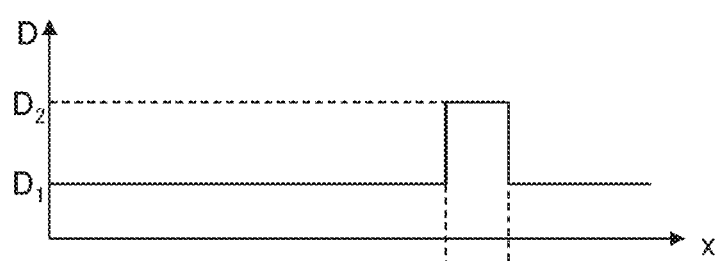
FIG. 7A is a graph illustrating a targeted non-uniform dose amount distribution.
Figure 7B:
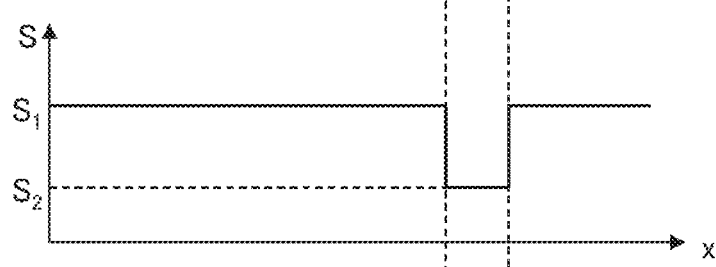
FIG. 7B is a graph illustrating a scanning speed distribution for achieving the dose amount distribution in FIG. 7A.

FIG. 7A is a graph illustrating a targeted non-uniform dose amount distribution and is equal to the dose amount distribution in FIG. 6C. FIG. 7B is a graph illustrating a scanning speed distribution for achieving the dose amount distribution in FIG. 7A and illustrates relationship between the scanning speed of the ion beam caused to scan in a reciprocating manner by the beam scanner 26 and the position in the x direction on the wafer surface to be processed irradiated with the beam. As illustrated in the figure, the scanning speed distribution is determined so that the scanning speed may be a first scanning speed $S_1$, which is relatively high, in a range in which the target dose amount is the first dose amount $D_1$, which is relatively small, while the scanning speed may be a second scanning speed $S_2$, which is relatively low, in a range in which the target dose amount is the second dose amount $D_2$, which is relatively large.

Figure 7C:
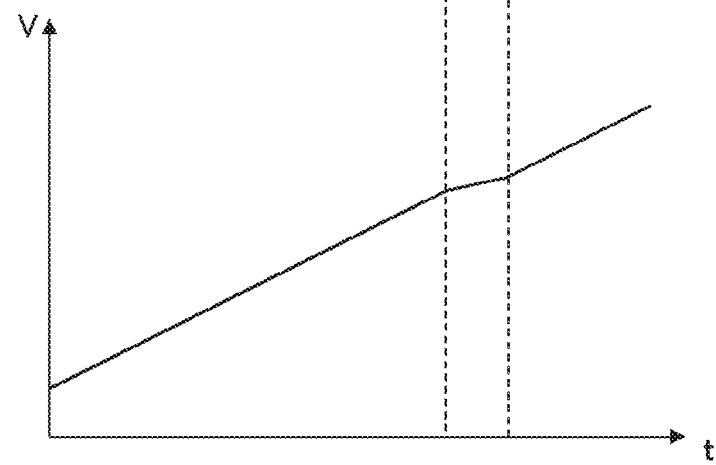
FIG. 7C is a graph illustrating a control waveform for achieving the dose amount distribution in FIG. 7A.

FIG. 7C is a graph illustrating a control waveform for achieving the dose amount distribution in FIG. 7A and illustrates changes of a control voltage V to be applied to the pair of the scanner electrodes 28 of the beam scanner 26 in relation to time t. As illustrated in the figure, the control waveform is determined so that the control voltage V may be inclined more in a range in which the scanning speed is the first scanning speed $S_1$, which is relatively high, while the control voltage V may be inclined less in a range in which the scanning speed is the second scanning speed $S_2$, which is relatively low. The parameter of the beam scanner 26 regarding the temporal changes of the control waveform is referred to as "a scanning parameter" herein. The "scanning parameter" may be a temporally-changing value of the voltage in the control waveform or may be one or a plurality of setting value(s) required to generate the control waveform.

In actual cases, there is a case where the dose amount distribution illustrated in FIG. 7A cannot be obtained even when the control waveform illustrated in FIG. 7C is output, and a difference may be generated between the shape of the target dose amount distribution and the shape of the beam current density distribution of the ion beam irradiated to the wafer surface to be processed. This difference can be generated due to generation of an optical aberration resulting from optical arrangement and the like of the beam scanner 26 and the collimating lens 30. Under such circumstances, the determination unit 64 corrects the scanning parameter based on a measurement result of the second beam measuring instrument 44 so as to obtain the beam current density distribution formed to correspond to the targeted dose amount distribution. That is, the determination unit 64 checks if the scanning parameter is appropriate based on a measurement result of the second beam measuring instrument 44 and corrects the scanning parameter as needed. At this time, the determination unit 64 may use a measurement result obtained when the control waveform illustrated in FIG. 7C has been output to the beam scanner 26 or a measurement result obtained when a reference control waveform that causes the scanning speed to be constant has been output to the beam scanner 26.

The determination unit 64 further determines a wafer movement speed parameter for the reciprocating movement mechanism 54 as a parameter for adjusting 5) the wafer in-plane average dose amount, 6) the wafer in-plane dose amount distribution, and 9) the dose amount distribution per region. The determination unit 64 determines the wafer movement speed parameters for the plurality of respective regions so that the dose amount distribution to be irradiated to each region may be a target value in a case where the scanning parameter is changed for each region. Meanwhile, the wafer movement speed parameter determined by the determination unit 64 is defined as a reference value in a case where the beam current amount during the implantation processing is within a predetermined range. In a case where the beam current amount fluctuates during the implantation processing, the wafer W is reciprocated at speed derived by multiplying the movement speed parameter serving as the reference value by a coefficient set in accordance with the fluctuation of the beam current amount to decrease an influence in which the dose amount changes due to the beam fluctuation.

The storage unit 66 stores the respective implantation conditions of the plurality of ion implantation processes received in the setting unit 62. The storage unit 66 stores the various parameters determined by the determination unit 64 in the aforementioned setup process for satisfying the respective implantation conditions.

The execution unit 68 operates the respective devices constituting the ion implantation apparatus 10 based on the respective implantation conditions and the various parameters stored in the storage unit 66 to execute the plurality of ion implantation processes. The execution unit 68 operates the respective devices so that the ion beam before scanning in a reciprocating manner may have the desired ion species, implantation energy, beam current amount, and beam current density based on the various parameters stored in the storage unit 66. The execution unit 68 also adjusts the twist angle and the tilt angle of the wafer W by controlling operations of the twist angle adjustment mechanism 56 and the tilt angle adjustment mechanism 58 based on the setting of the twist angle and the tilt angle stored in the storage unit 66.

The execution unit 68 further generates the control waveform for causing the ion beam to scan in a reciprocating manner based on the scanning parameter stored in the storage unit 66 and outputs the scanning parameter to the beam scanner 26 so that the ion beam may scan with a predetermined scanning speed distribution. The execution unit 68 operates the reciprocating movement mechanism 54 based on the wafer movement speed parameter stored in the storage unit 66 and the measurement result of the second beam measuring instrument 44 so that the wafer W may be reciprocated at desired movement speed. In this manner, the execution unit 68 operates the respective devices based on the parameters determined in the setup process and executes the ion implantation processes in accordance with the set implantation conditions.

In a case of performing a plurality of ion implantation processes having different implantation conditions to a same wafer successively, the control device 60 collectively executes the "setup process" in which parameters for satisfying the respective implantation conditions are determined before executing the plurality of ion implantation processes. In other words, when an implantation condition is to be switched between the plurality of ion implantation processes, the aforementioned "setup process" is not executed, but the parameters determined collectively beforehand are read to switch the implantation condition. Also, in a case where there are common or relevant implantation condition items among the plurality of ion implantation processes, determined parameters are used as they are, or parameters for another implantation process are calculated by performing predetermined calculation processing to the determined parameters, to shorten time required for the setup process.

Hereinbelow, a specific example of such a setup process will be described. Implantation conditions for a plurality of ion implantation processes to be performed will be described first, and the collective setup process for satisfying the implantation conditions will be described next.

[Plurality of Ion Implantation Processes]

In the present embodiment, by performing a plurality of ion implantation processes having different implantation conditions to a same wafer successively, desired ion implantation processing is achieved to the single wafer. In the present embodiment, four-time ion implantation processes having different implantation conditions are performed to a same wafer. In the respective ion implantation processes, the tilt angles of the wafer are set to be equal to each other, which are not 0 degrees, and the twist angles of the wafer are set to be different from each other (e.g., 0 degrees, 90 degrees, 180 degrees, and 270 degrees). Also, in the respective ion implantation processes, the respective implantation conditions are set so that each wafer in-plane dose amount distribution may be in a desired non-uniform shape, and so that each current density distribution of the ion beam to be irradiated to each region in the wafer surface is different.

Figure 8:
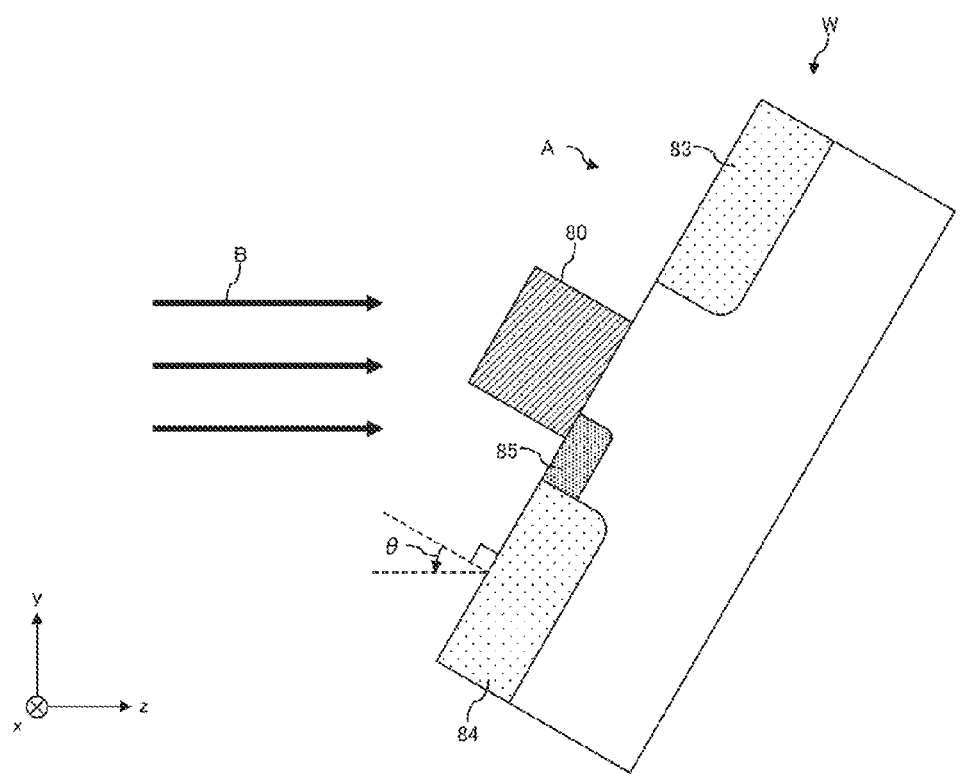
FIG. 8 schematically illustrates a high tilt angle implantation process.

FIG. 8 schematically illustrates a high tilt angle implantation process and illustrates an implantation process in a case where a tilt angle θ of the wafer is set to an angle, which is not 0 degrees. FIG. 8 illustrates a state where the ion beam B is irradiated to the wafer W in a tilted manner, in which a gate 80, a drain region 83, and a source region 84 are provided on the to-be-processed wafer surface A, to implant ions into a lower portion of a gate 80 and form a halo implantation region 85. The tilt angle θ of the wafer is set to several degrees or higher, and preferably 10 degrees or higher, to enable ion implantation into the lower portion of the gate 80. This tilt angle θ is set to be higher than an angle in implantation processing of slightly tilting the to-be-processed wafer surface A in consideration of crystalline property of the wafer W. In the present specification, such an implantation process is also referred to as "a high tilt angle implantation process." Such "a high tilt angle implantation process" may be performed to form the halo implantation region as in the present embodiment or for other purposes.

FIGS. 9A to 9D schematically illustrate changes of a twist angle φ. The twist angle φ is adjusted by rotating the wafer W with reference to a position (notch position) provided with an alignment mark 88. FIG. 9A illustrates a state where the twist angle φ is a predetermined angle $φ_0$ with reference to the notch position, and FIGS. 9B to 9D illustrate states where the twist angle φ has been changed by 90 degrees, 180 degrees, and 270 degrees, respectively, with reference to the twist angle $φ_0$ in FIG. 9A. In FIGS. 9A to 9D, the wafer W, in which gates 81 extending in a first direction and gates 82 extending in a second direction perpendicular to the first direction are provided on the to-be-processed wafer surface, is a target for implantation processing.

FIGS. 10A to 10D schematically illustrate high tilt angle implantation processes having different twist angles φ and then corresponding to the states of the wafer W illustrated in FIGS. 9A to 9D, respectively. By setting the tilt angle of the wafer W to $θ=θ_0$ and executing a plurality of implantation processes while changing the twist angle φ, halo implantation regions 85a to 85d can be formed directly under the gates 81 and the gates 82 having different gate extending directions from each other. As illustrated in FIG. 10A, by setting the twist angle φ so that each gate 81 extending in the first direction may be in the x direction, the first halo implantation region 85a is formed on one side of the gate 81 to be adjacent to the gate 81. Also, as illustrated in FIG. 10C, by rotating the twist angle φ by 180 degrees, the third halo implantation region 85c is formed on an opposite side of the gate 81. Similarly, as illustrated in FIG. 10B, by rotating the twist angle φ by 90 degrees so that each gate 82 extending in the second direction may be in the x direction, the second halo implantation region 85b is formed on one side of the gate 82 to be adjacent to the gate 82. Also, as illustrated in FIG. 10D, by rotating the twist angle φ by 270 degrees, the fourth halo implantation region 85d is formed on an opposite side of the gate 82. In this manner, by performing the high tilt angle implantation processes while changing the twist angle φ, the halo implantation regions can be formed at both sides of each of the gates extending in the different directions, that is, positions corresponding to both the drain region and the source region.

FIGS. 11A to 11D schematically illustrate high tilt angle implantation processes having different twist angles from each other and having a non-uniform dose amount distribution in the to-be-processed wafer surface and illustrate a case where a target value of the dose amount distribution is same as one described above in FIG. 6A. The dose amount distribution shape in the to-be-processed wafer surface is set with reference to the alignment mark 88 of the wafer W, and each implantation condition is set so that the dose amount distribution shape may be the same in relation to the alignment mark 88 even in a case where the twist angle is changed per implantation process. Accordingly, as illustrated in FIGS. 11A to 11D, when the wafer W is rotated to cause the twist angle to be changed, a position of the large dose amount region 92 seen from the ion beam is changed to a similarly-rotated position.

In the following description, implantation processes corresponding to FIGS. 11A to 11D are referred to as a first implantation process, a second implantation process, a third implantation process, and a fourth implantation process, respectively. Also, an implantation condition for the first implantation process in FIG. 11A is referred to as a first implantation condition, an implantation condition for the second implantation process in FIG. 11B is referred to as a second implantation condition, an implantation condition for the third implantation process in FIG. 11C is referred to as a third implantation condition, and an implantation condition for the fourth implantation process in FIG. 11D is referred to as a fourth implantation condition.

To achieve the non-uniform dose amount distribution illustrated in FIGS. 11A to 11D, a plurality of regions are set on the wafer surface to be processed, and an implantation condition is set so that the beam current density distribution of the ion beam to be irradiated to each region may be variable. More specifically, a region on the wafer surface to be processed is separated into a plurality of strip shaped regions set successively in the reciprocating movement direction of the wafer as illustrated in FIG. 6A, and target values of dose amount distributions are set for the plurality of regions, respectively, as illustrated in FIGS. 6B to 6D. FIGS. 6A to 6D described above correspond to the first implantation condition in the first implantation process. In the following description, to distinguish the regions Y11 to Y14 illustrated in FIG. 6A from regions in another implantation process, the regions Y11 to Y14 are also referred to as the first region Y11 in the first implantation process, the second region Y12 in the first implantation process, the third region Y13 in the first implantation process, and the fourth region Y14 in the first implantation process.

Figure 12A:
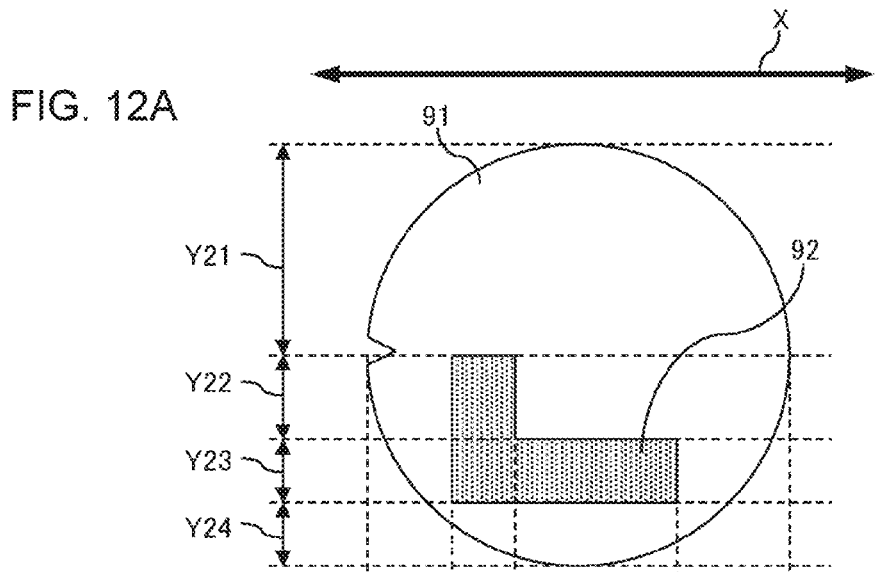
FIG. 12A schematically illustrates a plurality of regions set on the wafer surface to be processed in a second implantation process, and FIGS. 12B to 12D schematically illustrate target values of dose amount distributions set for the respective regions.
Figure 12B:
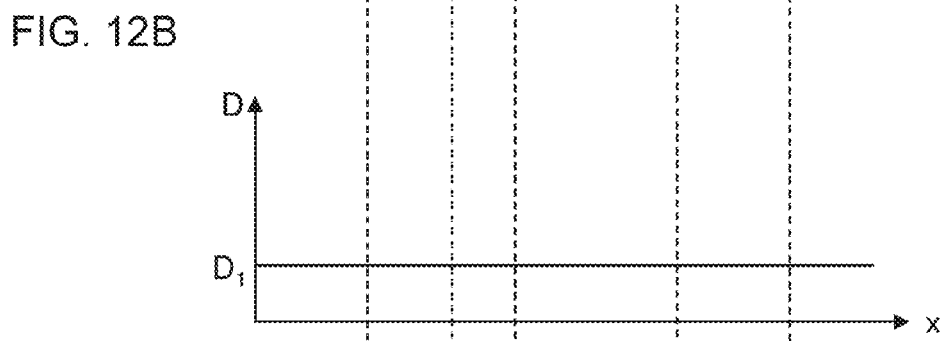
Figure 12C:
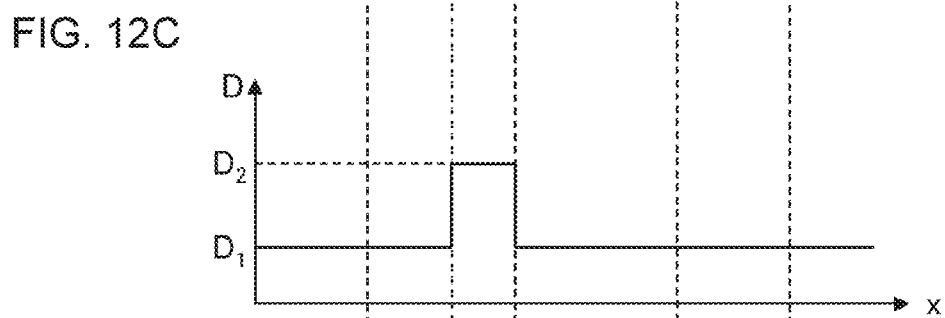
Figure 12D:
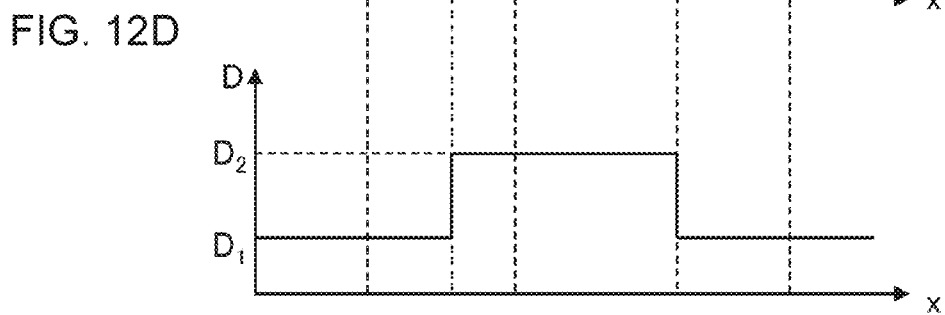

Similarly, as the second implantation condition in the second implantation process illustrated in FIG. 11B, a plurality of regions are set on the wafer surface to be processed, and target values of dose amount distributions are set for the respective regions. FIG. 12A schematically illustrates a plurality of regions Y21 to Y24 set on the wafer surface to be processed in the second implantation process, FIG. 12B illustrates a dose amount distribution corresponding to the first region Y21 or the fourth region Y24 in the second implantation process, FIG. 12C illustrates a dose amount distribution corresponding to the second region Y22 in the second implantation process, and FIG. 12D illustrates a dose amount distribution corresponding to the third region Y23 in the second implantation process.

Figure 13A:
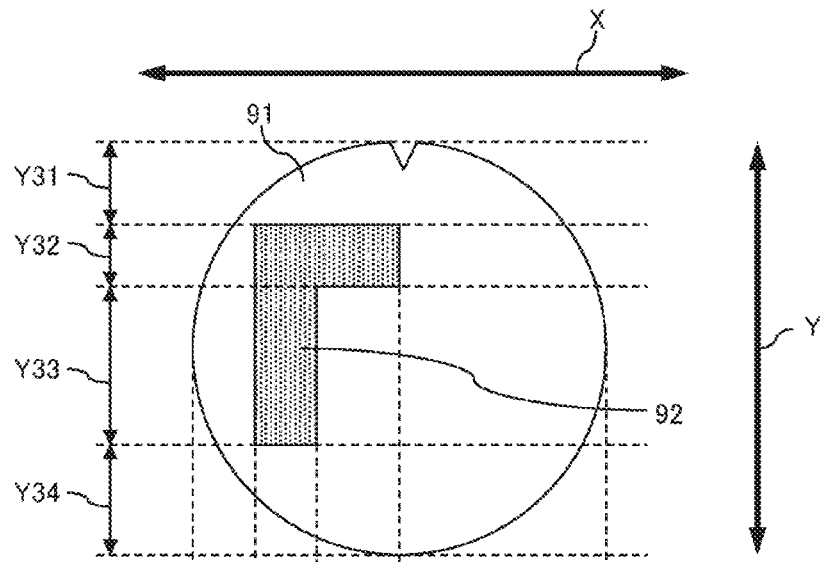
FIG. 13A schematically illustrates a plurality of regions set on the wafer surface to be processed in a third implantation process, and FIGS. 13B to 13D schematically illustrate target values of dose amount distributions set for the respective regions.
Figure 13B:
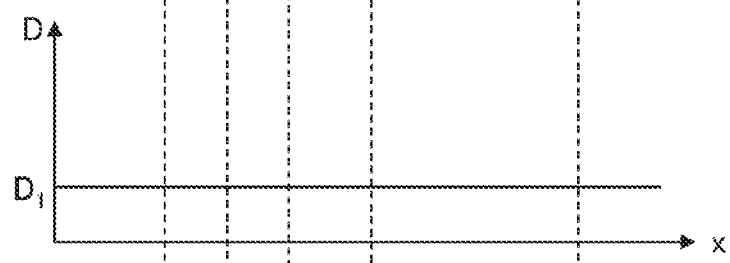
Figure 13C:
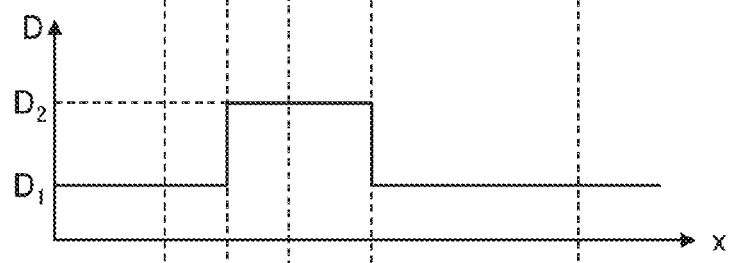
Figure 13D:
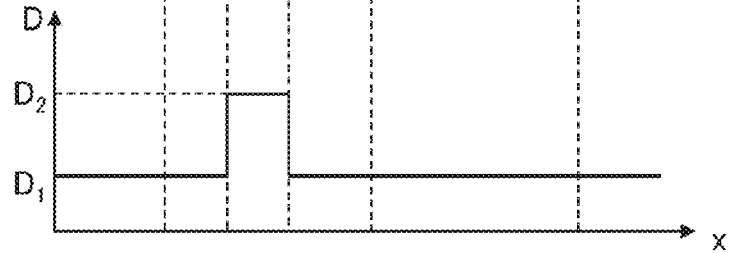

Also, an implantation condition is similarly set for the third implantation process illustrated in FIG. 11C. FIG. 13A schematically illustrates a plurality of regions Y31 to Y34 set on the wafer surface to be processed in the third implantation process. FIG. 13B illustrates a dose amount distribution corresponding to the first region Y31 or the fourth region Y34 in the third implantation process, FIG. 13C illustrates a dose amount distribution corresponding to the second region Y32 in the third implantation process, and FIG. 13D illustrates a dose amount distribution corresponding to the third region Y33 in the third implantation process. The plurality of regions and the target values of the dose amount distributions for the respective regions are set in advance as items of the third implantation conditions.

Figure 14A:
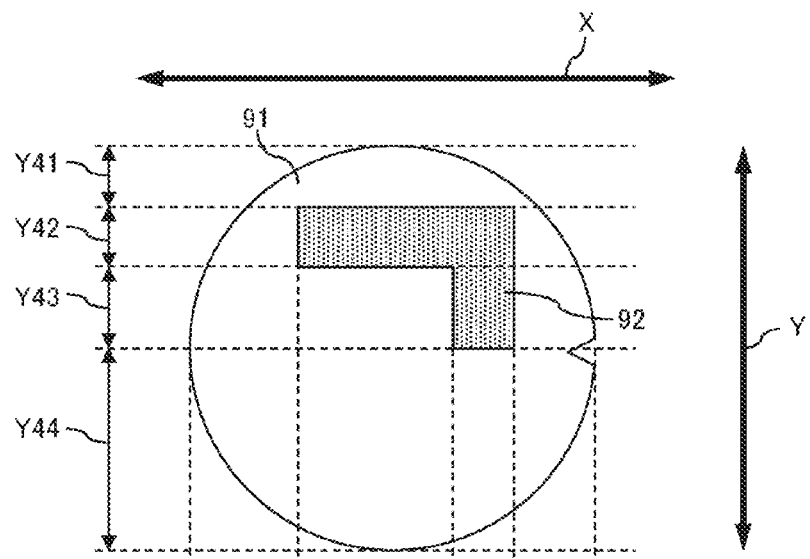
FIG. 14A schematically illustrates a plurality of regions set on the wafer surface to be processed in a fourth implantation process, and FIGS. 14B to 14D schematically illustrate target values of dose amount distributions set for the respective regions.
Figure 14B:
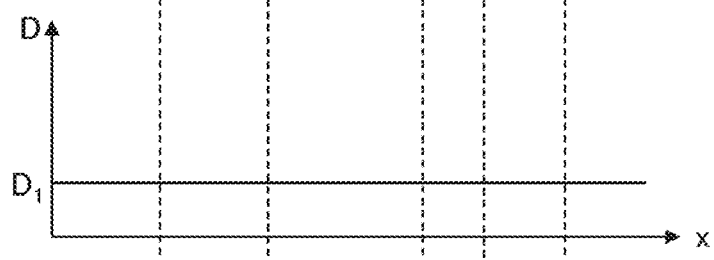
Figure 14C:
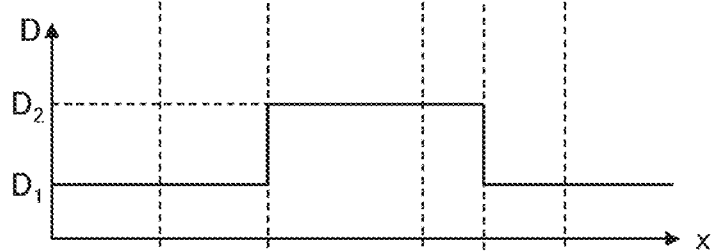
Figure 14D:
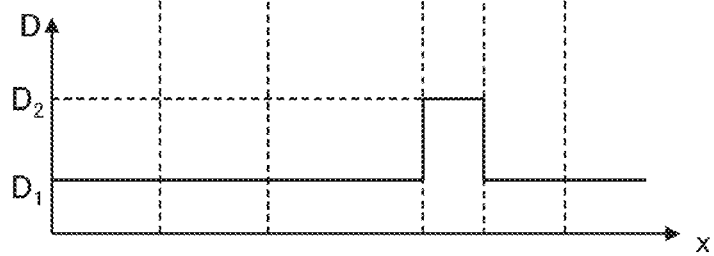

Further, an implantation condition is similarly set for the fourth implantation process illustrated in FIG. 11D. FIG. 14A schematically illustrates a plurality of regions Y41 to Y44 set on the wafer surface to be processed. FIG. 14B illustrates a dose amount distribution corresponding to the first region Y41 or the fourth region Y44 in the fourth implantation process, FIG. 14C illustrates a dose amount distribution corresponding to the second region Y42 in the fourth implantation process, and FIG. 14D illustrates a dose amount distribution corresponding to the third region Y43 in the fourth implantation process. The plurality of regions and the target values of the dose amount distributions for the respective regions are set in advance as items of the fourth implantation conditions.

Meanwhile, for the first implantation condition, the second implantation condition, the third implantation condition, and the fourth implantation condition according to the present embodiment, the same parameters are set in 1) the ion species, 2) the implantation energy, 3) the beam current amount, and 4) the beam current density. In a modification example, parameters of at least apart of these condition items may be set to be different among the implantation processes.

[Beam Setup Process]

Next, the collective setup process for satisfying the aforementioned respective first to fourth implantation conditions will be described. The collective setup process includes a first setup process for determining various parameters of the first implantation process, a second setup process for determining various parameters of the second implantation process, a third setup process for determining various parameters of the third implantation process, and a fourth setup process for determining various parameters of the fourth implantation process.

The first setup process includes a common parameter setting process for determining parameters for condition items common to the whole wafer among the various condition items set as the first implantation condition and a per-region parameter setting process for determining parameters for condition items set per region on the wafer surface to be processed. In the common parameter setting process, various parameters for adjusting 1) the ion species, 2) the implantation energy, 3) the beam current amount, 4) the beam current density, 7) the tilt angle, and 8) the twist angle are determined among the implantation condition items. In the per-region parameter setting process, the scanning parameter and the wafer movement speed parameter are determined per region.

Figure 15A:
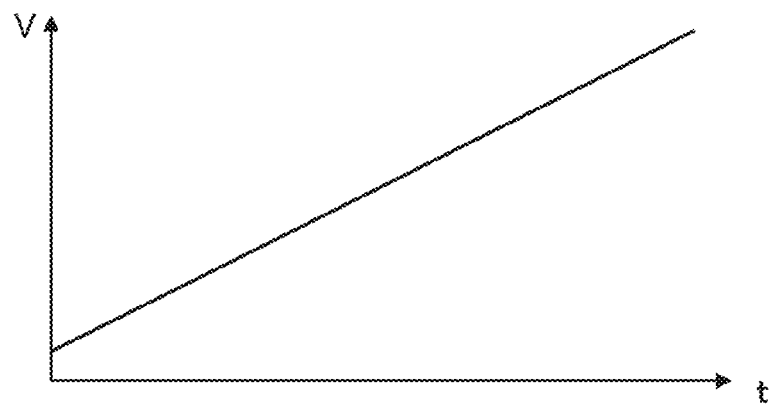
FIGS. 15A to 15C are graphs schematically illustrating scanning parameters for the respective regions in a first implantation process.
Figure 15B:
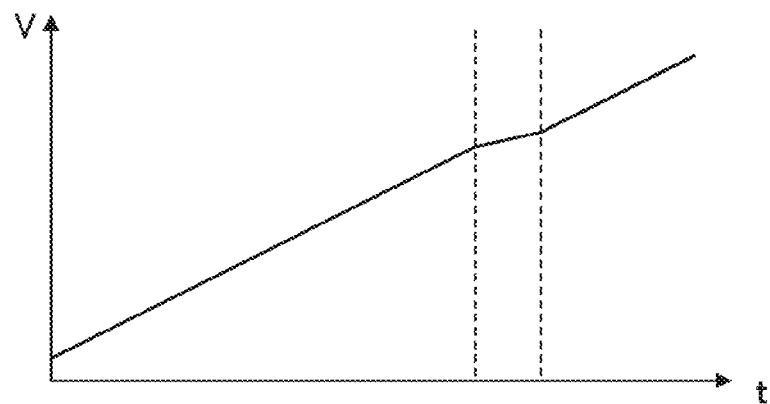
Figure 15C:
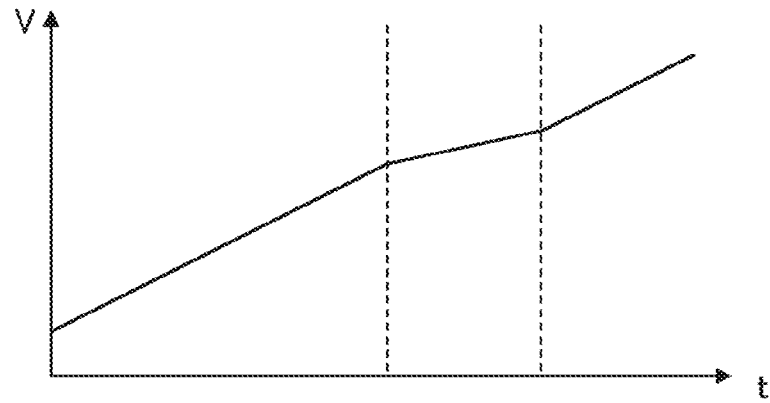

In the per-region parameter setting process in the first setup process, the scanning parameter and the wafer movement speed parameter are determined for each of the plurality of regions Y11 to Y14 illustrated in FIG. 6A. FIG. 15A illustrates a scanning parameter for the first region Y11, and the scanning parameter is determined so that the beam current density distribution of the ion beam to be irradiated to the to-be-processed wafer surface may be in a shape corresponding to the uniform dose amount distribution illustrated in FIG. 6B. FIG. 15B illustrates a scanning parameter for the second region Y12, and the scanning parameter is determined so that the beam current density distribution may be in a shape corresponding to the non-uniform dose amount distribution illustrated in FIG. 6C. FIG. 15C illustrates a scanning parameter for the third region Y13, and the scanning parameter is determined so that the beam current density distribution may be in a shape corresponding to the non-uniform dose amount distribution illustrated in FIG. 6D. These scanning parameters for the first region Y11, the second region Y12, and the third region Y13 are individually adjusted and determined based on measurement results of the beam current density distributions obtained by moving the center cup 42 in the beam scanning direction. The scanning parameters determined are stored in the storage unit 66.

On the other hand, a scanning parameter for the fourth region Y14 is not adjusted and determined based on a measurement result of the beam current density distribution, but the scanning parameter for the first region Y11, which has been determined, is used as it is as the scanning parameter for the fourth region Y14. The reason for this is that the target dose amount distribution is common to the first region Y11 and the fourth region Y14. Accordingly, the scanning parameter for the fourth region Y14 is the scanning parameter illustrated in FIG. 15A. Thus, the per-region parameter setting process for the fourth region Y14 can substantially be omitted, and time required for the first setup process can be shortened.

The second setup process is executed subsequent to the first setup process. In the common parameter setting process in the second setup process, parameter adjustment is performed only for condition items having different parameters from those of the first implantation condition. In the present embodiment, since only 8) the twist angle has a different parameter among the aforementioned condition items, only a parameter for 8) the twist angle is adjusted, and as for parameters for the other implantation condition items, the parameters determined in the first setup process are used as they are. Thus, time required for the second setup process can be shortened.

Figure 16A:
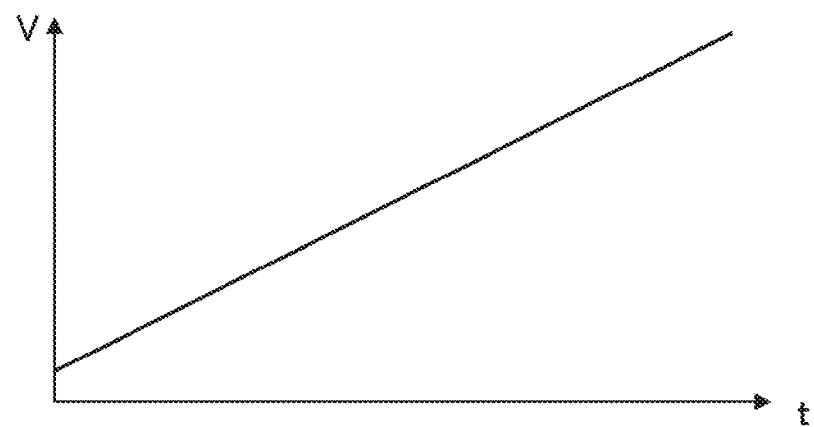
FIGS. 16A to 16C are graphs schematically illustrating scanning parameters for the respective regions in the second implantation process.
Figure 16B:
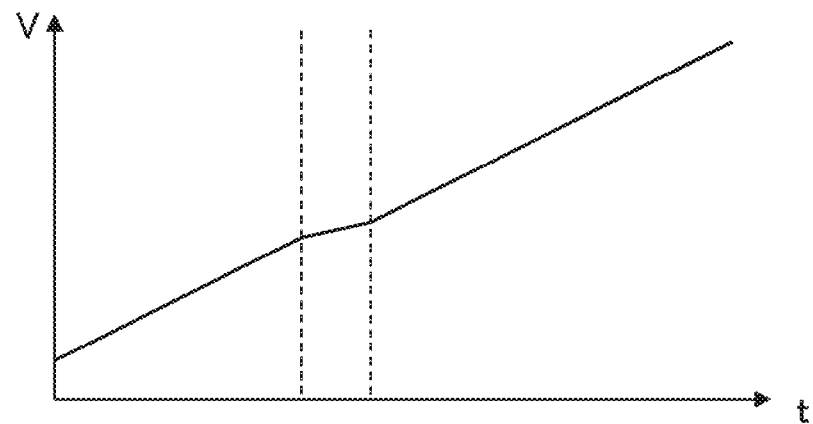
Figure 16C:
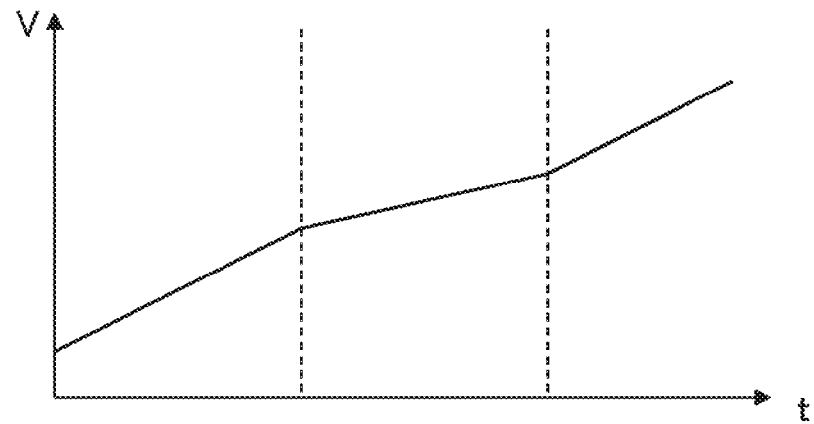

In the per-region parameter setting process in the second setup process, the scanning parameter and the wafer movement speed parameter are determined for each of the plurality of regions Y21 to Y24 illustrated in FIG. 12A. FIGS. 16A to 16C are graphs each schematically illustrating a scanning parameter for each region in the second implantation process. FIG. 16A illustrates a scanning parameter for the first region Y21 or the fourth region Y24 in the second implantation process. This scanning parameter is equal to the scanning parameter for the first region Y11 in the first implantation process. Then, the scanning parameter for the first region Y11 in the first implantation process, which has been already determined, is used as it is as the scanning parameter for the first region Y21 or the fourth region Y24 in the second implantation process. Thus, time required for the second setup process can be shortened.

On the other hand, since the dose amount distributions in the second region Y22 and the third region Y23 in the second implantation process do not correspond to the dose amount distributions in the respective regions Y11 to Y14 in the first implantation process, the dose amount distributions in the second region Y22 and the third region Y23 in the second implantation process are individually adjusted and determined based on measurement results of the beam current density distributions. FIG. 16B illustrates a scanning parameter for the second region Y22, and the scanning parameter is determined so that the beam current density distribution may be in a shape corresponding to the non-uniform dose amount distribution illustrated in FIG. 12C. FIG. 16C illustrates a scanning parameter for the third region Y23, and the scanning parameter is determined so that the beam current density distribution may be in a shape corresponding to the non-uniform dose amount distribution illustrated in FIG. 12D. The scanning parameters determined are stored in the storage unit 66.

The third setup process is executed subsequent to the second setup process. The common parameter setting process in the third setup process is executed in a similar manner to the second setup process. In the per-region parameter setting process in the third setup process, scanning parameters for the plurality of regions Y31 to Y34 illustrated in FIG. 13A are determined based on the scanning parameters determined in the first setup process. The dose amount distribution in the second region Y32 in the third implantation process illustrated in FIG. 13C and the dose amount distribution in the third region Y13 in the first implantation process illustrated in FIG. 6D are symmetric, and the dose amount distribution in the third region Y33 in the third implantation process illustrated in FIG. 13D and the dose amount distribution in the second region Y12 in the first implantation process illustrated in FIG. 6C are symmetric. Accordingly, by calculation processing with use of the symmetry, scanning parameters in the third implantation process can be determined based on the scanning parameters in the first implantation process. Here, being symmetric means being line-symmetric with respect to a straight line extending in the reciprocating movement direction of the wafer.

Figure 17A:
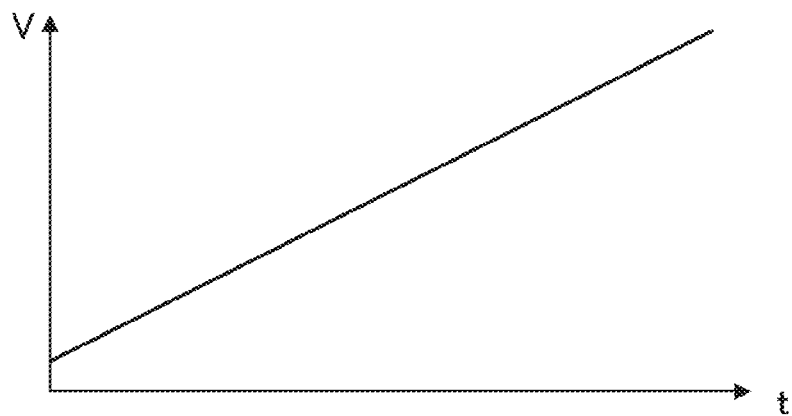
FIGS. 17A to 17C are graphs schematically illustrating scanning parameters for the respective regions in the third implantation process.

FIG. 17A illustrates a scanning parameter for the first region Y31 or the fourth region Y34 in the third implantation process. This scanning parameter is equal to the scanning parameter for the first region Y11 in the first implantation process, and the scanning parameter for the first region Y11 in the first implantation process, which has been already determined, is used as it is as the scanning parameter for the first region Y31 or the fourth region Y34 in the third implantation process.

Figure 17B:
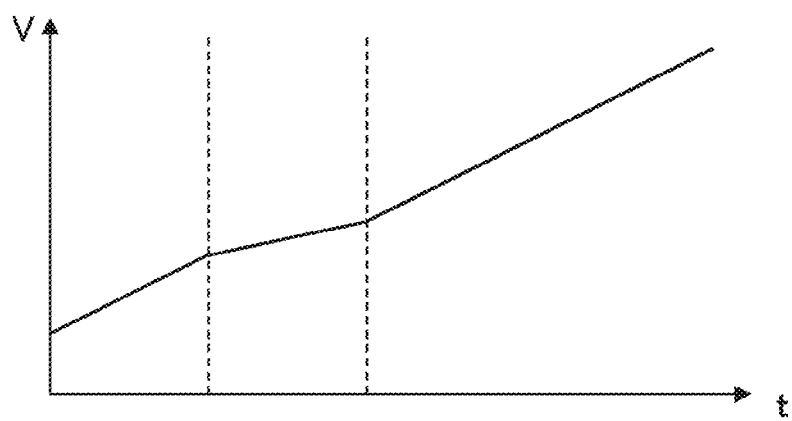
Figure 17C:
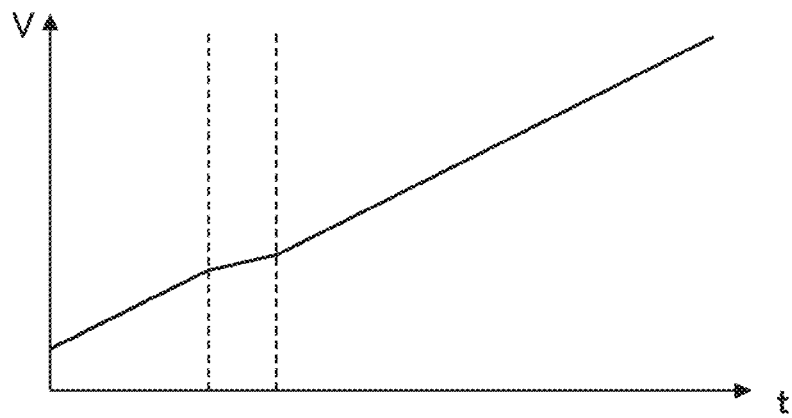

FIG. 17B illustrates a scanning parameter for the second region Y32 in the third implantation process. This scanning parameter is obtained by inverting (horizontally inverting) the control waveform for the third region Y13 in the first implantation process illustrated in FIG. 15C in terms of the time axis and inverting (vertically inverting) the control waveform in terms of the voltage axis. FIG. 17C illustrates a scanning parameter for the third region Y33 in the third implantation process. This scanning parameter is obtained by inverting (horizontally inverting) the control waveform for the second region Y12 in the first implantation process illustrated in FIG. 15B in terms of the time axis and inverting (vertically inverting) the control waveform in terms of the voltage axis.

Accordingly, the scanning parameters for the second region Y32 and the third region Y33 in the third implantation process can be determined by conducting predetermined calculation processing to the scanning parameters for the third region Y13 and the second region Y12 in the first implantation process. In this manner, in the per-region parameter setting process in the third setup process, the scanning parameters in the third implantation process can be determined only by the predetermined calculation processing based on the scanning parameters in the first implantation process. Thus, time required for the third setup process can be shortened.

Figure 18A:
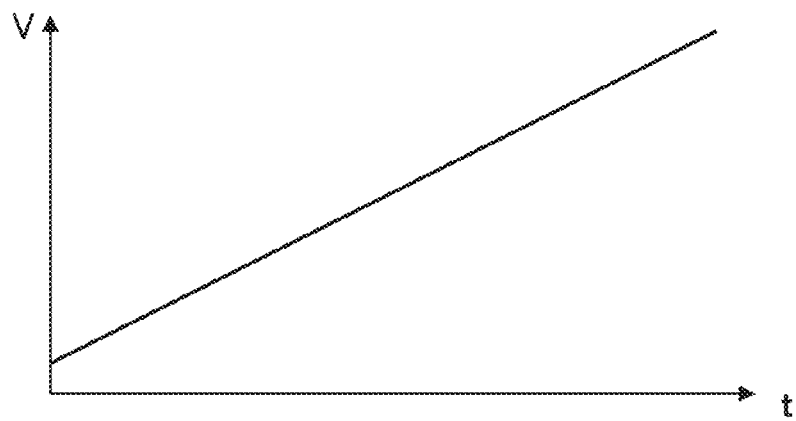
FIGS. 18A to 18C are graphs schematically illustrating scanning parameters for the respective regions in the fourth implantation process.

The fourth setup process is executed subsequent to the third setup process. The fourth setup process is executed in a similar manner to the third setup process, and scanning parameters for the respective regions in the fourth implantation process are determined based on the scanning parameters determined in the first setup process or the second setup process. FIG. 18A illustrates a scanning parameter for the first region Y41 or the fourth region Y44 in the fourth implantation process. As this scanning parameter, the scanning parameter for the first region Y11 in the first implantation process is used as it is.

Figure 18B:
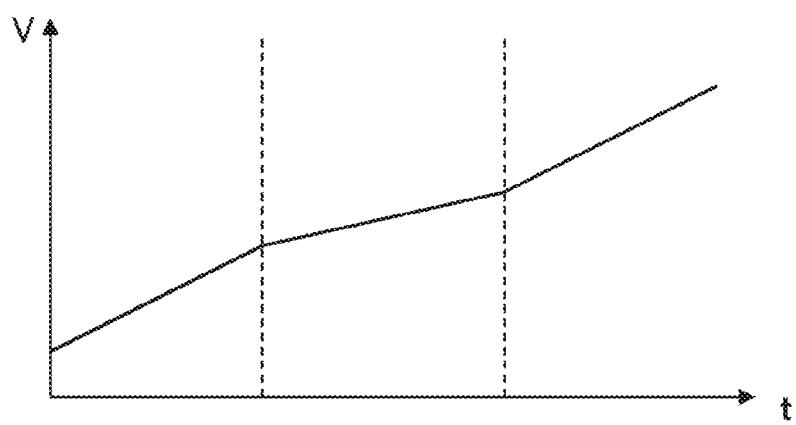
Figure 18C:
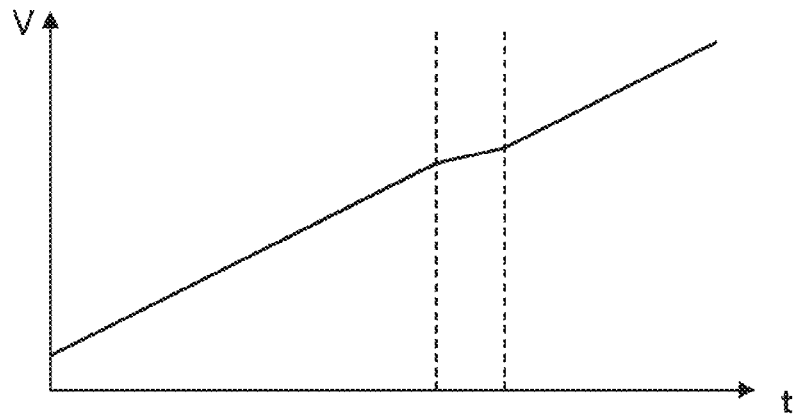

FIG. 18B illustrates a scanning parameter for the second region Y42 in the fourth implantation process. This scanning parameter is obtained by inverting (horizontally inverting) the control waveform for the third region Y23 in the second implantation process illustrated in FIG. 16C in terms of the time axis and inverting (vertically inverting) the control waveform in terms of the voltage axis. FIG. 18C illustrates a scanning parameter for the third region Y43 in the fourth implantation process. This scanning parameter is obtained by inverting (horizontally inverting) the control waveform for the second region Y22 in the second implantation process illustrated in FIG. 16B in terms of the time axis and inverting (vertically inverting) the control waveform in terms of the voltage axis.

In this manner, in the fourth implantation process, the scanning parameters for the respective regions in the fourth implantation process can be determined by conducting predetermined calculation processing to the scanning parameters for any of the regions in the first implantation process or the second implantation process. Thus, time required for the fourth setup process can be shortened.

Meanwhile, a setting method for determining another scanning parameter based on a scanning parameter determined is registered from the setting unit 62 as a part of the implantation condition in advance. For example, registered is a setting method in which the scanning parameter for the first region Y11 in the first implantation process determined in the first setup process is used as the scanning parameter for the first region Y21 in the second implantation process. Also, registered is a setting method in which a scanning parameter obtained by conducting predetermined inversion processing to the scanning parameter for the third region Y13 in the first implantation process determined in the first setup process is used as the scanning parameter for the second region Y32 in the third implantation process.

Figure 19:
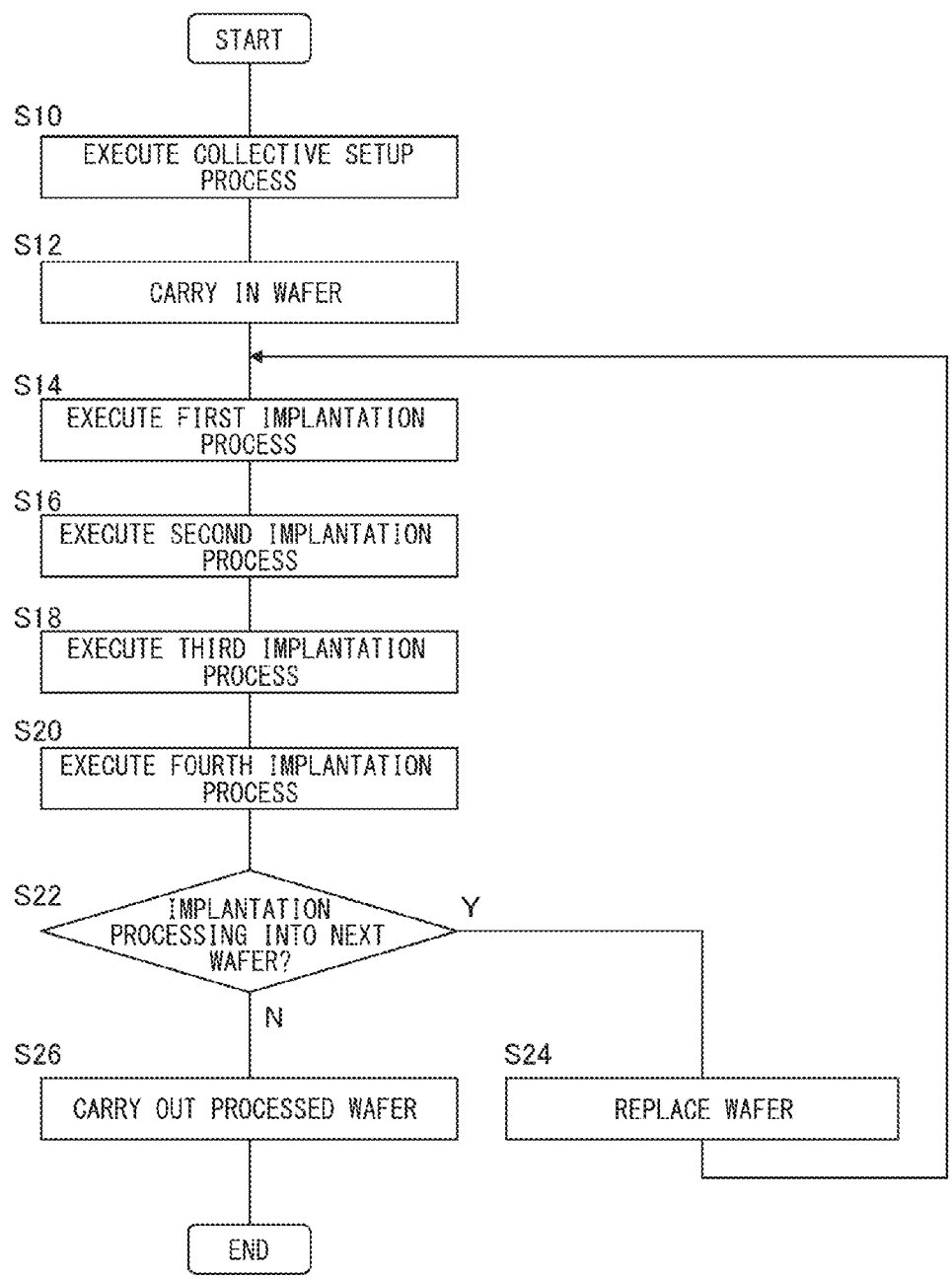
FIG. 19 is a flowchart illustrating an operation procedure of the ion implantation apparatus according to an embodiment.

Operations of the ion implantation apparatus 10 configured as above will be described. FIG. 19 is a flowchart illustrating an operation procedure of the ion implantation apparatus 10. First, the collective setup process is executed to determine various parameters required for execution of the first implantation process to the fourth implantation process (S10). Subsequently, a wafer to be processed is carried into the implantation processing chamber 16 (S12), and the first implantation process is executed to the carried wafer surface (S14). Subsequently, the implantation condition is switched by reading various parameters for the second implantation process to execute the second implantation process (S16), the implantation condition is switched to the implantation condition for the third implantation process to execute the third implantation process (S18), and the implantation condition is switched to the implantation condition for the fourth implantation process to execute the fourth implantation process (S20). When implantation processing to a next wafer is required (Y in S22), the processed wafer is replaced with the wafer before being processed (S24), and the steps S14 to S22 are repeated. When no implantation processing to a next wafer is required (N in S22), the processed wafer is carried from the implantation processing chamber 16 (S26) to end the flow.

According to the present embodiment, even in a case of performing a plurality of ion implantation processes having different implantation conditions to a same wafer successively, various parameters for all of the ion implantation processes can be determined collectively before starting the implantation processing to the wafer. Thus, even in a case of changing the implantation condition between the implantation processes, no setup process needs to be performed at the time of the change, and the change of the implantation condition can be performed by reading the parameters determined collectively. Consequently, time required for implantation processing to one wafer can be shortened further than in a case of performing the setup process each time of the change of the implantation condition. Also, even in a case of performing implantation processing to a plurality of wafers successively, implantation processing to second and subsequent wafers can be executed by sequentially reading parameters which have been determined. Thus, time required for implantation processing to a plurality of wafers can be shortened as well. Thus, according to the present embodiment, even in a case of performing non-uniform implantation into the wafer surface with use of a plurality of implantation processes having non-uniform dose amount distributions while changing the twist angle, it can be prevented from lowering the productivity due to switching of the implantation condition while implantation accuracy is kept high.

According to the present embodiment, even in a case where the target dose amount distribution shapes in the wafer surface are different in the plurality of ion implantation processes, when any one of the dose amount distribution shapes in the respective regions is equal to another one, various parameters determined for any one of the regions are used for another region. Thus, time required for the setup process can be shortened further than in a case of separately performing parameter adjustment based on a measurement result of a beam current density distribution for each region in each of a plurality of implantation processes. Also, even when anyone of the dose amount distribution shapes in the respective regions is different from another one, the scanning parameters for the respective regions are derived by the calculation processing with use of the symmetry of the dose amount distributions, and time required for the setup process can thus be shortened further. Accordingly, even in a case of performing non-uniform implantation into the wafer surface with use of the plurality of implantation processes, it can be prevented from lowering of the productivity due to switching of the implantation condition can further be restricted while implantation accuracy is kept high.

While the invention has been described with reference to the above-described embodiments, the invention is not limited to the above-described embodiments, and appropriate combinations or substitutions of the embodiments are also included in the invention. Further, the combinations or the process sequences of the embodiments may be appropriately changed or various modifications such as a change in design may be made in the embodiments based on the knowledge of the person skilled in the art. Then, the embodiments modified in that way are also included in the scope of the invention.

In the aforementioned embodiment, described is a case where the respective implantation conditions are determined so that the tilt angles in the plurality of ion implantation processes may be set to be equal to each other, which are not 0 degrees. In a modification example, the respective implantation conditions may be determined so that the tilt angles in the plurality of ion implantation processes may be set to be different from each other, which are not 0 degrees. Also, the tilt angles in some implantation processes may be 0 degrees while the tilt angles in the other implantation processes may be angles which are not 0 degrees. Further, the tilt angles in all of the plurality of implantation processes may be 0 degrees.

If a divergence angle of the ion beam incident into the wafer surface to be processed is low, that is, if parallelism of the ion beam irradiated toward the wafer surface to be processed is high, even when the twist angles are changed while keeping the tilt angles being 0 degrees, a large difference due to the different twist angles may not occur in features of the implantation regions. Specifically, it might be less likely to occur that the different twist angles cause positions where the halo implantation regions are formed to be changed, as illustrated in FIGS. 10A to 10D. However, the ion beam irradiated to the wafer surface to be processed has a slight divergence angle, and there is a variation in the traveling directions of ions constituting the ion beam. Also, the variation in the traveling directions of ions constituting the ion beam may not be symmetric with respect to the beam traveling direction. Thus, changing the twist angles may cause the features of the implantation regions to have differences. For this reason, even when the tilt angles are set to 0 degrees, the dose amount distribution shapes need to be adjusted accurately in the implantation processes with the respective twist angles. According to the present embodiment, even in a case of performing the plurality of ion implantation processes under such conditions, various parameters for achieving the respective implantation conditions can be determined accurately in short time, and both quality and productivity of implantation processing can thus be satisfied.

In the aforementioned embodiment, described is a case where the dose amount distribution among the plural kinds of implantation condition items is set per region. In a modification example, another kind of implantation condition item may be set per region. For example, 2) the implantation energy may be set per region so that the implantation condition for the ion beam can be switched for each region irradiated with the ion beam to execute the implantation processes. In this case, in the per-region parameter setting process included in the aforementioned setup process, setting parameters for the energy adjusting mechanisms adapted to switch the implantation energy per region are determined.

In the aforementioned embodiment, described is a case where the scanning parameters for the respective regions are derived by the calculation processing with use of the symmetry of the dose amount distributions. In a modification example, in a case where a dose amount distribution in a specified region can be obtained by addition, subtraction, multiplication, or division of setting of a plurality of dose amount distributions, calculation processing of arbitrarily combining a plurality of determined scanning parameters may be conducted to calculate scanning parameters for respective regions. Accordingly, even in a case of setting dose amount distributions not having the symmetry, the scanning parameters for the respective regions can be determined by the calculation processing.

In the aforementioned embodiment, described is a case where the electric-field-type beam scanner in which an electric field is applied to the ion beam to cause the ion beam to scan is used. In a modification example, a magnetic-field-type beam scanner in which a magnetic field is applied to the ion beam to cause the ion beam to scan may be used. In this case, the aforementioned scanning parameter per region is determined in the per-region parameter setting process so that the scanning speed distribution of the ion beam that is caused to scan by the magnetic-field-type beam scanner may be a desired distribution.

It should be understood that the invention is not limited to the above-described embodiment, but may be modified into various forms on the basis of the spirit of the invention. Additionally, the modifications are included in the scope of the invention.

What is claimed is:

1. An ion implantation apparatus configured to perform a plurality of ion implantation processes having different implantation conditions to a same wafer successively, the ion implantation apparatus comprising:
   an energy adjusting mechanism that enables adjustment of implantation energy of an ion beam;
   a beam scanner that causes the ion beam to scan in a reciprocating manner in a predetermined scanning direction;
   a measuring instrument that measures a beam current density distribution in the scanning direction of the ion beam that scans in the reciprocating manner;
   a platen movement device that holds a wafer so that the ion beam that scans in the reciprocating manner is irradiated to a wafer surface to be processed; and
   a control device that determines a scanning parameter of the beam scanner based on a measurement result of the measuring instrument so that the beam current density distribution corresponds to a target value set in an implantation condition, and that performs each of the ion implantation processes, wherein
   the platen movement device includes a reciprocating movement mechanism that causes the wafer to reciprocate in a reciprocating movement direction perpendicular to the scanning direction, a twist angle adjustment mechanism that adjusts a twist angle between an alignment mark provided at an outer circumferential portion of the wafer and a reference position by rotating the wafer around a normal line of the wafer surface to be processed, and a tilt angle adjustment mechanism that adjusts a tilt angle between a traveling direction of the ion beam toward the wafer surface to be processed and the normal line of the wafer surface to be processed, wherein
   the plurality of ion implantation processes are: (a) provided with respective implantation conditions so that twist angles of the wafer differ from each other; (b) configured so that the ion beam that scans in the reciprocating manner is irradiated to the wafer surface to be processed that moves in the reciprocating movement direction; and (c) provided with the respective implantation conditions so that a target value of the beam current density distribution of the ion beam that is irradiated to the wafer surface to be processed is variable in accordance with a position of the wafer in the reciprocating movement direction, wherein,
   before performing the plurality of ion implantation processes to the same wafer successively, the control device executes a setup process in which a plurality of scanning parameters corresponding to a plurality of target values of the beam current density distributions set as the respective implantation conditions of the plurality of ion implantation processes are determined collectively, wherein
   the control device includes a setting unit that receives setting of the respective implantation conditions of the plurality of ion implantation processes, a determination unit that determines the plurality of scanning parameters in accordance with the respective implantation conditions set in the setting unit, a storage unit that stores the plurality of scanning parameters determined by the determination unit, and an execution unit that executes the plurality of ion implantation processes by controlling the beam scanner in accordance with the plurality of scanning parameters stored in the storage unit, wherein
   the determination unit collectively determines in the setup process the plurality of scanning parameters based on measurement results of the measuring instrument and causes the plurality of scanning parameters determined to be stored in the storage unit, and wherein,
   after the plurality of scanning parameters are collectively determined, the execution unit executes the plurality of ion implantation processes to the same wafer successively in accordance with the plurality of scanning parameters stored in the storage unit.

2. The ion implantation apparatus according to claim 1, wherein
   the plurality of ion implantation processes are provided with the respective implantation conditions so that target values of dose amount distributions in the wafer surface to be processed are different from each other, and wherein
   the control device collectively determines in the setup process a plurality of wafer movement speed parameters of the reciprocating movement mechanism for achieving the dose amount distributions in the wafer surface to be processed set as the respective implantation conditions of the plurality of ion implantation processes.

3. The ion implantation apparatus according to claim 1, wherein
   the control device collectively determines in the setup process setting parameters of the energy adjusting mechanism for achieving implantation energy set as the respective implantation conditions of the plurality of ion implantation processes.

4. The ion implantation apparatus according to claim 1, wherein
   the plurality of ion implantation processes are provided with the respective implantation conditions so that tilt angles of the wafer are set to be equal to each other, which are not 0 degrees.

5. The ion implantation apparatus according to claim 1, wherein the plurality of ion implantation processes are provided with the respective implantation conditions so that tilt angles of the wafer are 0 degrees.

6. The ion implantation apparatus according to claim 1, wherein
the determination unit checks if the plurality of respective scanning parameters are appropriate based on measurement results of the measuring instrument, corrects the scanning parameters as needed, and causes the corrected scanning parameters to be stored in the storage unit.

7. The ion implantation apparatus according to claim 1, wherein
the setting unit receives setting of dose amount distributions for a plurality of regions set on the wafer surface to be processed as the respective implantation conditions of the plurality of ion implantation processes, and wherein
the determination unit collectively determines in the setup process the plurality of scanning parameters for achieving the dose amount distributions for the plurality of regions.

8. The ion implantation apparatus according to claim 7, wherein
the plurality of regions are a plurality of strip shaped regions set successively in the reciprocating movement direction on the wafer surface to be processed held at a twist angle set in each of the implantation conditions of the plurality of ion implantation processes.

9. The ion implantation apparatus according to claim 7, wherein
the scanning parameter sets a scanning speed distribution of the ion beam irradiated to each of the plurality of regions.

10. The ion implantation apparatus according to claim 7, wherein
the determination unit checks if some of the plurality of scanning parameters required to execute the plurality of ion implantation processes are appropriate based on measurement results of the measuring instrument, corrects the scanning parameters as needed, and causes the corrected scanning parameters to be stored in the storage unit while the determination unit determines the others of the plurality of scanning parameters based on the scanning parameters that have been checked and stored in the storage unit and causes the scanning parameters to be stored in the storage unit.

11. The ion implantation apparatus according to claim 10, wherein
the determination unit determines the others of the plurality of scanning parameters by conducting predetermined calculation processing to the scanning parameters that have been checked and stored in the storage unit.

12. The ion implantation apparatus according to claim 10, wherein
the plurality of ion implantation processes includes a first implantation process and a second implantation process, wherein
the storage unit stores a first scanning parameter that sets a scanning speed distribution of the ion beam to be irradiated to a first region serving as one of the plurality of regions set on the wafer surface to be processed in the first implantation process and a second scanning parameter that sets a scanning speed distribution of the ion beam to be irradiated to a second region serving as one of the plurality of regions set on the wafer surface to be processed in the second implantation process, and wherein
the determination unit checks if the first scanning parameter is appropriate based on a measurement result of the measuring instrument, corrects the first scanning parameter as needed, and causes the corrected first scanning parameter to be stored in the storage unit while the determination unit determines the second scanning parameter based on the first scanning parameter that has been stored in the storage unit and causes the second scanning parameter to be stored in the storage unit.

13. The ion implantation apparatus according to claim 12, wherein
a dose amount distribution in the scanning direction set for the second region is equal to a dose amount distribution in the scanning direction set for the first region, and wherein
the determination unit uses the first scanning parameter that has been stored in the storage unit as the second scanning parameter.

14. The ion implantation apparatus according to claim 12, wherein
a dose amount distribution in the scanning direction set for the second region and a dose amount distribution in the scanning direction set for the first region are line-symmetric with respect to a straight line extending in the reciprocating movement direction, and wherein
the determination unit determines the second scanning parameter by conducting predetermined calculation processing to the first scanning parameter that has been stored in the storage unit.

15. The ion implantation apparatus according to claim 12, wherein
a dose amount distribution in the scanning direction set for the first region and a dose amount distribution in the scanning direction set for the second region are in non-uniform shapes.

16. The ion implantation apparatus according to claim 7, wherein
the determination unit collectively determines in the setup process wafer movement speed parameters of the reciprocating movement mechanism for the plurality of respective regions.

17. The ion implantation apparatus according to claim 7, wherein
the determination unit collectively determines in the setup process setting parameters of the energy adjusting mechanism for the plurality of respective regions.

* * * * *